(12) United States Patent
Kanda

(10) Patent No.: US 7,889,558 B2
(45) Date of Patent: *Feb. 15, 2011

(54) NONVOLATILE SEMICONDUCTOR MEMORY DEVICE IN WHICH AN AMOUNT OF DATA TO BE STORED IN A MEMORY CELL IS ALLOCATED TO EVERY OTHER WORD LINE UNITS OF ONE WORD LINE

(75) Inventor: Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

This patent is subject to a terminal disclaimer.

(21) Appl. No.: 12/028,480

(22) Filed: Feb. 8, 2008

(65) Prior Publication Data

US 2008/0205148 A1 Aug. 28, 2008

(30) Foreign Application Priority Data

Feb. 9, 2007 (JP) ............................. 2007-030408

(51) Int. Cl.
  *G11C 16/04* (2006.01)
(52) U.S. Cl. ............... 365/185.17; 365/94; 365/185.03; 365/185.21; 365/185.28
(58) Field of Classification Search ................... 365/94, 365/185.03, 185.17, 185.21, 185.28
  See application file for complete search history.

(56) References Cited

U.S. PATENT DOCUMENTS

| | | | |
|---|---|---|---|
| 6,937,514 B2 | 8/2005 | Hasegawa | |
| 7,116,603 B2 | 10/2006 | Kanda et al. | |
| 7,196,950 B2 | 3/2007 | Kanda et al. | |
| 7,224,617 B2 | 5/2007 | Takeuchi | |
| 7,269,073 B2 | 9/2007 | Takeuchi | |
| 7,539,053 B2 * | 5/2009 | Kanda | ..... 365/185.03 |
| 2005/0207220 A1 | 9/2005 | Takeuchi | |
| 2007/0124531 A1* | 5/2007 | Nishihara | ..... 711/3 |
| 2007/0147114 A1* | 6/2007 | Takeuchi | ..... 365/185.03 |
| 2007/0291556 A1* | 12/2007 | Kamei | ..... 365/189.09 |

FOREIGN PATENT DOCUMENTS

| | | |
|---|---|---|
| JP | 2004-152405 | 5/2004 |
| JP | 2004-327865 | 11/2004 |
| JP | 2005-267687 | 9/2005 |
| JP | 2005-267821 | 9/2005 |

* cited by examiner

*Primary Examiner*—Hoai V Ho
(74) *Attorney, Agent, or Firm*—Oblon, Spivak, McClelland, Maier & Neustadt, L.L.P.

(57) ABSTRACT

A nonvolatile semiconductor memory device having a plurality of word lines and a plurality of bit lines and a plurality of sense amplifiers, each amplifier being connected to one of the plurality of bit lines respectively and a memory cell array including a memory cell region including a plurality of memory strings having a plurality of electrically reprogrammable memory cells connected in series, each of the memory cells having two or more storage states, said plurality of memory cells being connected to a corresponding word line of the plurality of word lines respectively, the plurality of memory strings being connected to a corresponding bit line of the plurality of bit lines respectively, and at the time of programming all of the plurality of bit lines are selected, the number of the storage states being different in two of the memory cells which are adjacent on the same bit line.

24 Claims, 18 Drawing Sheets

NONVOLATILE SEMICONDUCTOR MEMORY DEVICE IN WHICH AN AMOUNT OF DATA TO BE STORED IN A MEMORY CELL IS ALLOCATED TO EVERY OTHER WORD LINE UNITS OF ONE WORD LINE

CROSS REFERENCE TO RELATED APPLICATION

This application is based upon and claims the benefit of priority from the prior Japanese Patent Applications No. 2007-030408, filed on Feb. 9, 2007; the entire contents of which are incorporated herein by reference.

BACKGROUND OF THE INVENTION

1. Field of the Invention

This invention relates to a nonvolatile semiconductor memory device and particularly, a NAND type flash memory.

2. Description of the Related Art

In recent years, in order to reduce the unit cost per one bit of data and increase storage capacity in a nonvolatile semiconductor memory device such as a NAND type flash memory, a flash memory which stores multi-bit data, that is, a volume of information of more than two levels of data, in one memory cell has been developed. In the case of storing four-levels (2 bits) of data in one memory cell, four threshold distributions of a memory cell exist corresponding to four-levels of data.

It is generally preferred that the form of the threshold distribution of a memory cell of this NAND type flash memory is sharp and narrow in width while considering drops in power supply voltage or a variations in manufacture. Consequently, because a memory cell has capacitive coupling with an adjacent memory cell, what is called interference of an adjacent memory cell occurs caused by programming of an adjacent memory cell and the width of a threshold distribution becomes wide. This influence is particularly prominent with miniaturization and becomes an obstacle to forming a more sharp and narrow threshold distribution when attempting to store multi-levels data.

Consequently, by narrowing the step-up width of a programming voltage Vpgm and programming, it is possible to reduce the widening of a threshold distribution. However, when narrowing the step-up width of a programming voltage Vpgm, the number of times the programming voltage Vpgm is applied increases, programming time becomes longer, programming speed is reduced. Therefore, guarantees of high speed programming while attempting to increase capacity by storing multi-levels data are being demanded. Japanese Laid Open Patent 2005-267687, Japanese Laid Open Patent 2005-267821, Japanese Laid Open Patent 2004-152405, Japanese Laid Open Patent 2004-327865 are used as reference.

BRIEF SUMMARY OF THE INVENTION

According to one embodiment of the present invention, a nonvolatile semiconductor memory device comprises a plurality of word lines, a plurality of bit lines, a plurality of sense amplifiers, each amplifier being connected to one of said plurality of bit lines respectively, and a memory cell array including a memory cell region including a plurality of memory strings having a plurality of electrically reprogrammable memory cells connected in series, each of said memory cells having two or more storage states, said plurality of memory cells being connected to a corresponding word line of said plurality of word lines respectively, said plurality of memory strings being connected to a corresponding bit line of said plurality of bit lines respectively, and at the time of programming all of said plurality of bit lines are selected, the number of said storage states being different in two of said memory cells which are adjacent on the same bit line.

According to one embodiment of the present invention, a nonvolatile semiconductor memory device comprises a plurality of word lines having odd word lines and even word lines, a plurality of bit lines, a plurality of sense amplifiers, each amplifier being connected to one of said plurality of bit lines respectively, and a memory cell array including a memory cell region including a plurality of memory strings having a plurality of electrically reprogrammable memory cells connected in series, each of said memory cells having two or more storage states, said plurality of memory cells being connected to a corresponding word line of said plurality of word lines respectively, said plurality of memory strings being connected to a corresponding bit line of said plurality of bit lines respectively, and at the time of programming all of said plurality of bit lines are selected, the number of said storage states of said memory cells connected to said odd word lines is different from the number of said storage states of said memory cells connected to said even word lines.

According to one embodiment of the present invention, a nonvolatile semiconductor memory device comprises a plurality of word lines, a plurality of bit lines, a plurality of sense amplifiers, each amplifier being connected to one of said plurality of bit lines respectively, and a memory cell array including a memory cell region including a plurality of memory strings having a plurality of electrically reprogrammable memory cells connected in series, each of said memory cells having two or more storage states, said plurality of memory cells being connected to a corresponding word line of said plurality of word lines respectively, said plurality of memory strings being connected to a corresponding bit line of said plurality of bit lines respectively, each of first addresses being allocated to one of said plurality of said memory cells, each of second addresses being allocated to two of said plurality of memory cells which are adjacent on the same bit line, said memory cell being selected by a corresponding first address of said first addresses and a corresponding second address of said second addresses, and at the time of programming all of said plurality of bit lines are selected, the number of said storage states being different in two of said memory cells which are adjacent on the same bit line.

DETAILED DESCRIPTION OF THE INVENTION

Figure 1:
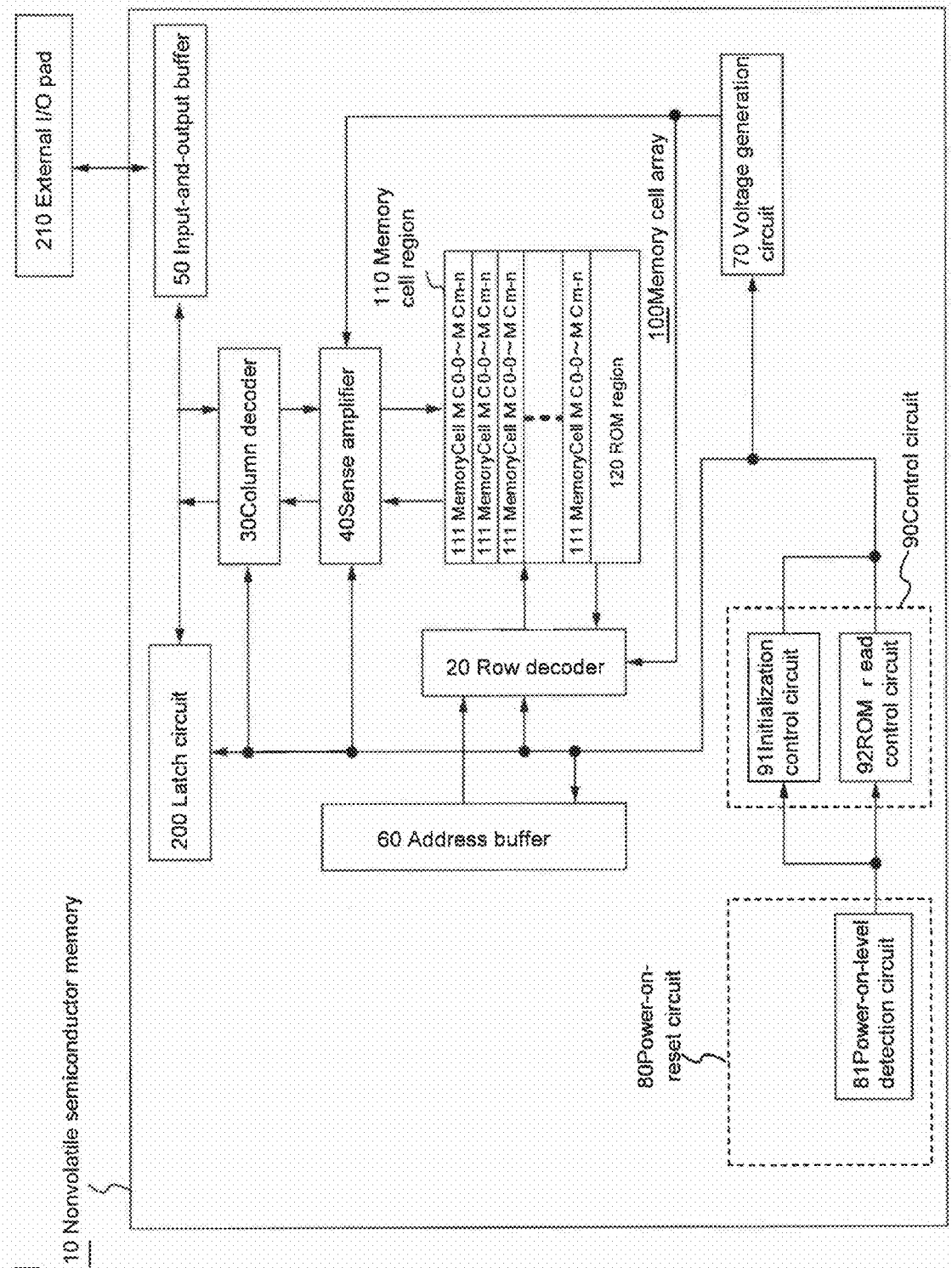
FIG. 1 is an outline construction of a nonvolatile semiconductor memory device relating to one embodiment of this invention.

Below, the embodiments of a nonvolatile semiconductor memory device related to this invention using a NAND type flash memory as an example will be explained in detail while referring to the drawings. Furthermore, the embodiments show an example of a nonvolatile semiconductor memory device of this invention and the nonvolatile semiconductor memory device of this invention is not limited to these embodiments.

First Embodiment

[Construction of a Nonvolatile Semiconductor Memory Device]

An outline construction drawing of a NAND type flash memory relating to embodiment one of a nonvolatile semiconductor memory device of this invention is shown in FIG. 1. The nonvolatile semiconductor memory device 10 shown in FIG. 1 includes a memory cell array 100 in which is arranged with a plurality of electrically rewritable memory cells 111, a row decoder 20, a column decoder 30, a sense amplifier 40, an input/output buffer 50, an address buffer 60, a voltage generation circuit 70, a power-on-reset circuit 80, a control circuit 90 and a latch circuit 200. Also, a state machine, a command interface and a selection circuit are further arranged. However, these are not shown in FIG. 1. The nonvolatile semiconductor memory device relating to this embodiment performs sending and receiving of data and control signals (command) with an external input/output pad 210.

In the nonvolatile semiconductor memory device 10 relating to the first embodiment of this invention, data and control signals are input from the external input/output buffer 210 via the data input/output buffer 50 to the command interface and column decoder 30. The state machine controls the column decoder 30 and the row decoder 20 based on the control signals and data. The state machine outputs access information of the memory cell 111 of the memory cell array 100 to the column decoder 30 and the row decoder 20. The row decoder 20 controls the selection circuit based on the access information and data and activates the memory cell 111. The column decoder 30 is arranged between the sense amplifier 40 and a data bus, reads data in units of 8 bits or 16 bits from the latch of the sense amplifier 40 corresponding to a selected address and transmits the data to a data bus. The transmitted data is output to the external input/output pad 210 via the data input/output buffer 50. Also, at the time of programming, the column decoder 30 loads data into the latch of the sense amplifier 40. The sense amplifier 40 which is connected to each bit line 140 of the memory cell array 100 includes a latch function for storing read data and programming data and amplifies the sense of the voltage of the bit line 140 at the time of reading a page and latches the read data. The programming data which is input externally at the time of programming is latched and programming data is loaded into the bit line 140 by the sense amplifier 40.

Figure 2:
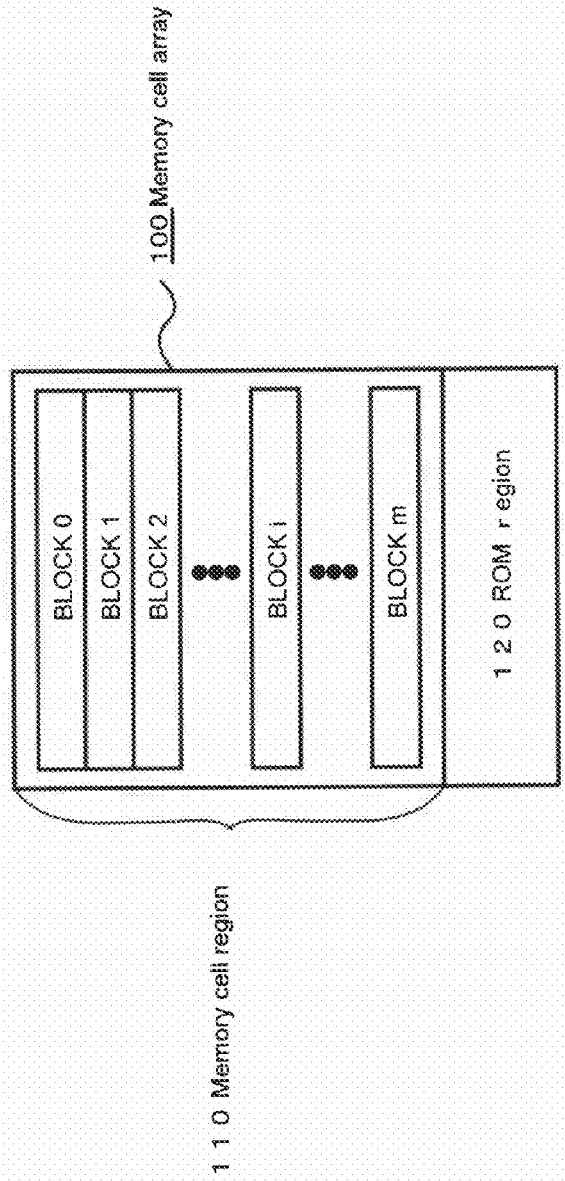
FIG. 2 is an outline construction of a memory cell array of the nonvolatile semiconductor memory device relating to one embodiment of this invention.

Here, the construction of a memory cell array is shown in FIG. 2. As is shown in FIG. 2, the memory cell array 100 of the nonvolatile semiconductor device 10 relating to the first embodiment of this invention is divided into a total of m blocks (BLOCK0, BLOCK1, BLOCK2, . . . , BLOCKi, . . . , BLOCKm). Here a block is the smallest unit of data erasure. Also, the memory cell array of the nonvolatile semiconductor device 100 relating to the first embodiment of this invention includes a ROM region 120 for storing various data (fuse data) which requires reading after power activation such as trimming data for time adjustment or various types of voltage adjustment and also includes replacement address data for replacing a defective cell which exists in the memory cell array 110 with a different redundancy cell, in addition to a usual memory cell region 110 for storing data.

The fuse data which is stored in the ROM region 120 is sent to the latch circuit 200 via the sense amplifier 40 and the column decoder 30 and stored. The operation in which the fuse data which is stored in this ROM region 120 is read and is set to the latch circuit 200 is called a ROM read operation.

Figure 3:
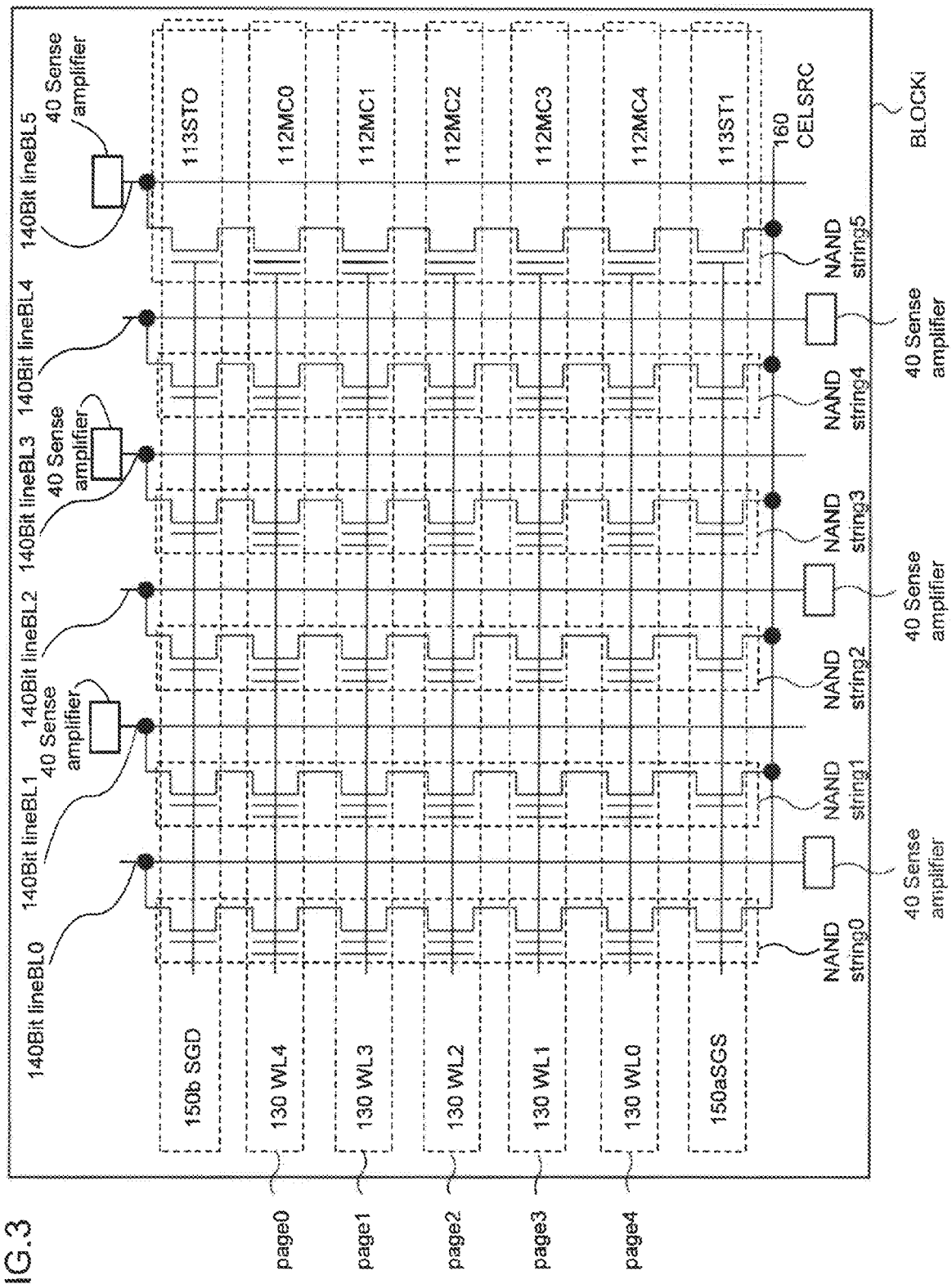
FIG. 3 is an outline construction of the interior of a memory cell block of the nonvolatile semiconductor memory device relating to one embodiment of this invention.

Each block BLOCK0-BLOCKm, similar to block BLOCKi shown representatively in FIG. 3, is constructed of six NAND strings 0-5. FIG. 3 is a drawing which shows the construction of the block BLOCKi of a memory cell of the nonvolatile semiconductor device relating to the first embodiment of this invention. Here, the NAND strings means a construction in which the memory cells are connected in a series and selection gate transistors ST are arranged at both ends of the memory cell connected in series. According to the present embodiment, each NAND string is constructed by connecting five memory cells MC0-MC4 (111) in a series and one end is connected to a bit line BL140 (BL0-BL5) via a selection gate transistor ST0 (113) which is connected to a drain side selection gate line SGD 150. Also, the other end of each NAND string is connected to a common source line CELSRC 160 via a selection gate transistor ST1 (113) which is connected to a source side selection gate line SGS150. The control gate of each memory cell 111 is connected to a word line 130 (WL0-WL4). In FIG. 3 five word lines are shown as an example, however it is not limited to this.

Here, the six memory cells 111 which are connected to one word line 130 stores a plurality of data (multi-levels bit data) according to the amount of electron injection in each memory cell 111. These six memory cells 111 comprise a unit called a page.

Also, according to the present embodiment, the number of blocks which comprise a memory cell array was given as m blocks and one block was given to include six NAND strings comprising five memory cells, however, it is not limited to this. The number of blocks, the number of memory cells and the number of NAND strings may be changed according to desired capacity. Also, in the present embodiment, an example of a NAND type flash memory in which one NAND string is connected to one bit line 140 was explained, however, in the NAND type flash memory of the present invention, one bit line 140 may be connected to a plurality of NAND strings.

Figure 4:
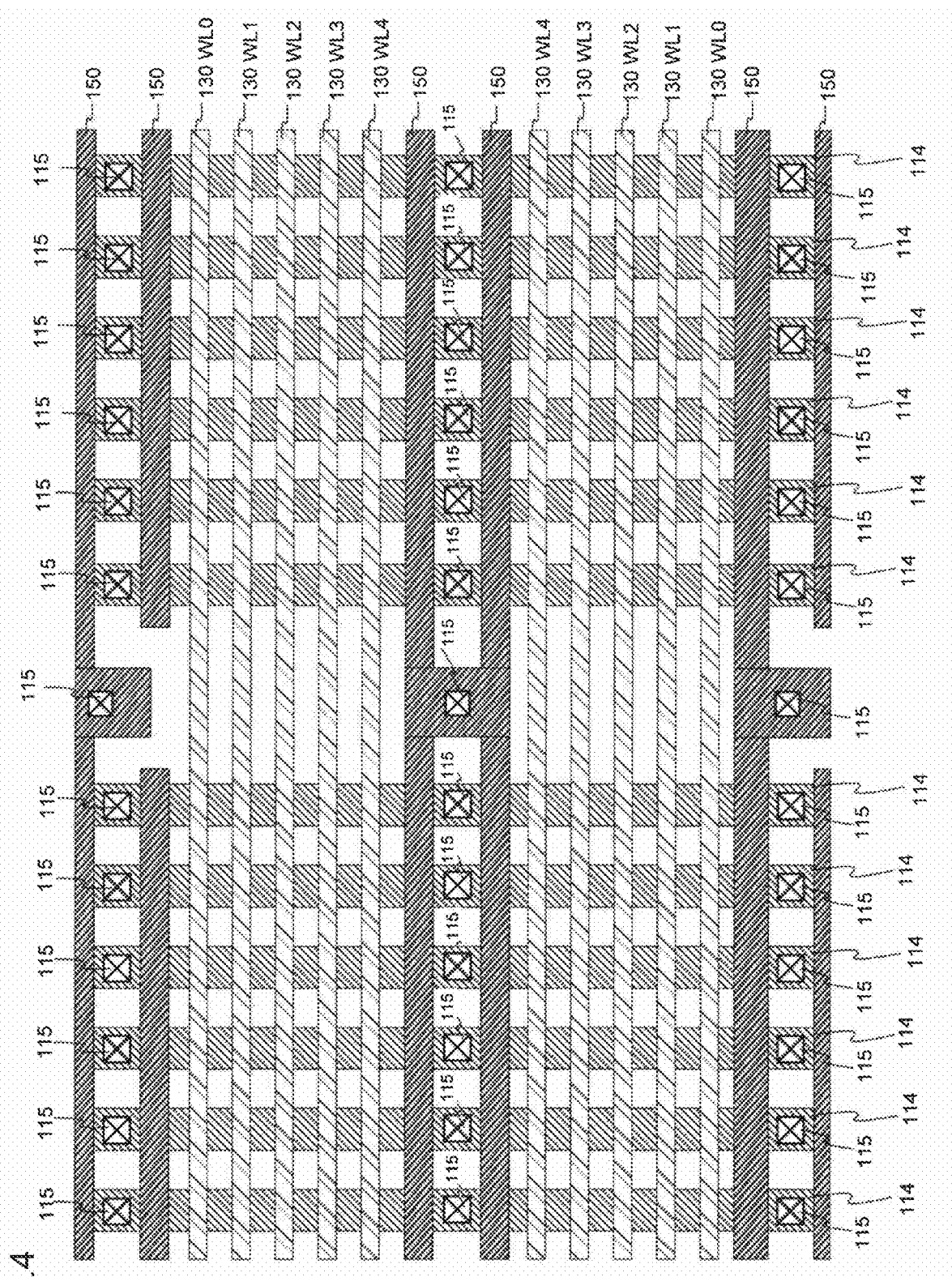
FIG. 4 is a typical characteristic of the layout of a NAND cell of the nonvolatile semiconductor memory device relating to one embodiment of this invention.

FIG. 4 is a drawing which typically shows a NAND cell layout in the nonvolatile semiconductor memory device 10 relating to the first embodiment of this invention. Each NAND string is arranged axisymmetrically with a bit line contact at the center. Because the selection gate lines SGD150b and SGS150a are important wires related to access when reading (data) they are shunted by a wire metal layer (not shown in the drawings). Also, shunting by the wire metal layer is to lower the resistance of the selection gate line SGD150 which has a high resistance by electrically connecting it to a low resistance wire layer. The drain side selection gate line SGD150b shares a wire with an adjacent NAND string because there is insufficient area in a relationship which as much as possible makes the resistance of the shunt line smaller. While a diffusion layer 114 for forming a channel in a memory cell is lined in a direct line in a vertical direction towards FIG. 4 and is connected to an M0 by a diffusion layer—M0 contact (below, referred to as a CB contact 115) in the area between the selection gate lines SGD150b. In addition, the diffusion layer 114 is connected to an M1 of a bit line which is arranged in a horizontal direction facing FIG. 4 by the M0-M1 contact (below referred to as a V1 layer) (not shown in the drawings). While the diffusion layer 114 is connected to the M0 by the CB contact 115 in the area surrounded by the selection gate lines SGS150a and is connected to a source line in the cell array region by a cell source line 160 of the M0 layer which is commonly connected in a horizontal direction facing FIG. 4.

The sense amplifier 40 includes a latch function which stores read data and programming data. The sense amplifier 40 sense amplifies the voltage of the bit line 140 at the time of reading a page, latches the read data and also latches the programming data input externally and loads the programming data into the bit line 140 at the time of programming. In recent years there have also been demands for a reduction in the area of the sense amplifier 40 due to the progress of miniaturization.

In order to achieve this reduction in the area of the sense amplifier 140, a free running method is adopted in which reading is pre-charged, and the bit line 140 voltage is discharged by a cell current after the bit line 140 is floated. However, in the free running method because the bit line 140 is floated the bit line is easily affected by noise. Therefore, in order to prevent bit line noise, there is a need to connect a non selected bit line 140 at the time of reading, to VSS and there is a need for bit line shield technology. That is, one sense amplifier is arranged for two supplementing bit lines 140 and the bit lines 140 is divided into even bit lines 140e and odd bit lines 140o. Then, the even bit lines and odd bit lines are read and programmed separately, and protected from noise by shielding by connecting non selected bit lines 140 to VSS at the time of reading. In this way, because a throughput current does not flow, it becomes possible to increase a cell array region without taking a lot of wire layering and large capacity and low cost can be realized.

However, when this bit line shield is performed, an excessive programming stress arises to a memory cell which is connected to one word line. In addition, a problem arises wherein programming requires a long time and requests for high speed operations can not be satisfied. Consequently, when the priority is high speed operation, a sense amplifier 40 is arranged at the ends of every bit line 140 alternately as shown in FIG. 3 in order to improve high speed and satisfy demands for a reduction of the placement area of the sense amplifier 40. In this case, there is no need to divide the bit lines 140 into even and odd bit lines and high speed can be realized by single programming. In addition, a reduction in bit line 140 noise can be realized by applying a large current. However, there is a need to frequently perform reading while paying attention to a rise in a source line voltage and the size of chip becomes larger.

Presently, for the above stated reasons, the two aims, namely high speed operation and large capacity with a reduction in chip size are dealt with separately. In the present invention, the nonvolatile semiconductor memory device 10 is arranged with one sense amplifier 40 for every bit line 140 in order to realize high speed operation and the effects of capacity coupling with an adjacent memory cell in this nonvolatile semiconductor memory device 10 are reduced, and programming speed is improved while achieving large capacity. Therefore, in the nonvolatile semiconductor memory device 10 related to one embodiment of the present invention, one sense amplifier 40 is connected to each bit line 140.

The address buffer 60 encodes the address data input externally and transmits it to the row decoder 20 or the column decoder 30. The row decoder 20 or the column decoder 30 decodes the encoded data and selects the word line 130 and the bit line 140 which is to be accessed.

The voltage generation circuit 70 receives a mode signal, a voltage generation timing control signal and a voltage level setting signal from the control circuit 90 and generates an internal voltage required for various modes such as a standard voltage Vref of reference or a programming voltage Vpgm using a power voltage VCC supplied externally. Then, the voltage generation circuit 70 outputs the internal voltage to a circuit which requires it such as the row decoder 20 or the sense amplifier 40.

A power on reset circuit 80 detects the activation of power, resets the register of the control circuit 90 and outputs a signal for performing an initialization operation. The power on reset circuit 80 generates a power on reset signal which becomes a LOW level until the power voltage activated by the power reaches a predetermined voltage level and becomes HIGH after the predetermined voltage level is reached and outputs to the control circuit 90.

The control circuit 90 receives a command input externally and generates a mode signal such as a read operation, programming operation and erasure operation. Then, the control circuit 90 outputs a timing control signal for generating a required voltage for each mode and a voltage setting signal, an address control signal and a memory cell access control signal in accordance with a register which stores a voltage setting level.

Also, the control circuit 90 outputs a control signal for initializing the address buffer 60, the column decoder 30, the row decoder 20, the sense amplifier 40, the latch circuit 200 and the voltage generation circuit 70 in FIG. 1 based on a power on reset signal received from the power on reset circuit 80. Therefore, the control circuit 90 includes an initialization control circuit 91 for outputting the control signal for initializing and a ROM read control circuit 92 which outputs a control signal for controlling a ROM read operation.

The operation of the power on reset circuit 80 and the control circuit 90 are outlined below. That is, the power voltage VCC is initialized and when it reaches a power on detection level a power on reset signal is output from the power on reset circuit 80 and a control signal for controlling a ROM read operation is output from the ROM read control circuit 92 and the ROM read operation starts.

(Reading and Programming Operation of Multi-Bit Level Data in a Nonvolatile Semiconductor Memory Device)

The operations of programming, reading and erasing of the nonvolatile semiconductor memory device 10 relating to the first embodiment of the present invention by this construction will be explained.

Figure 5:
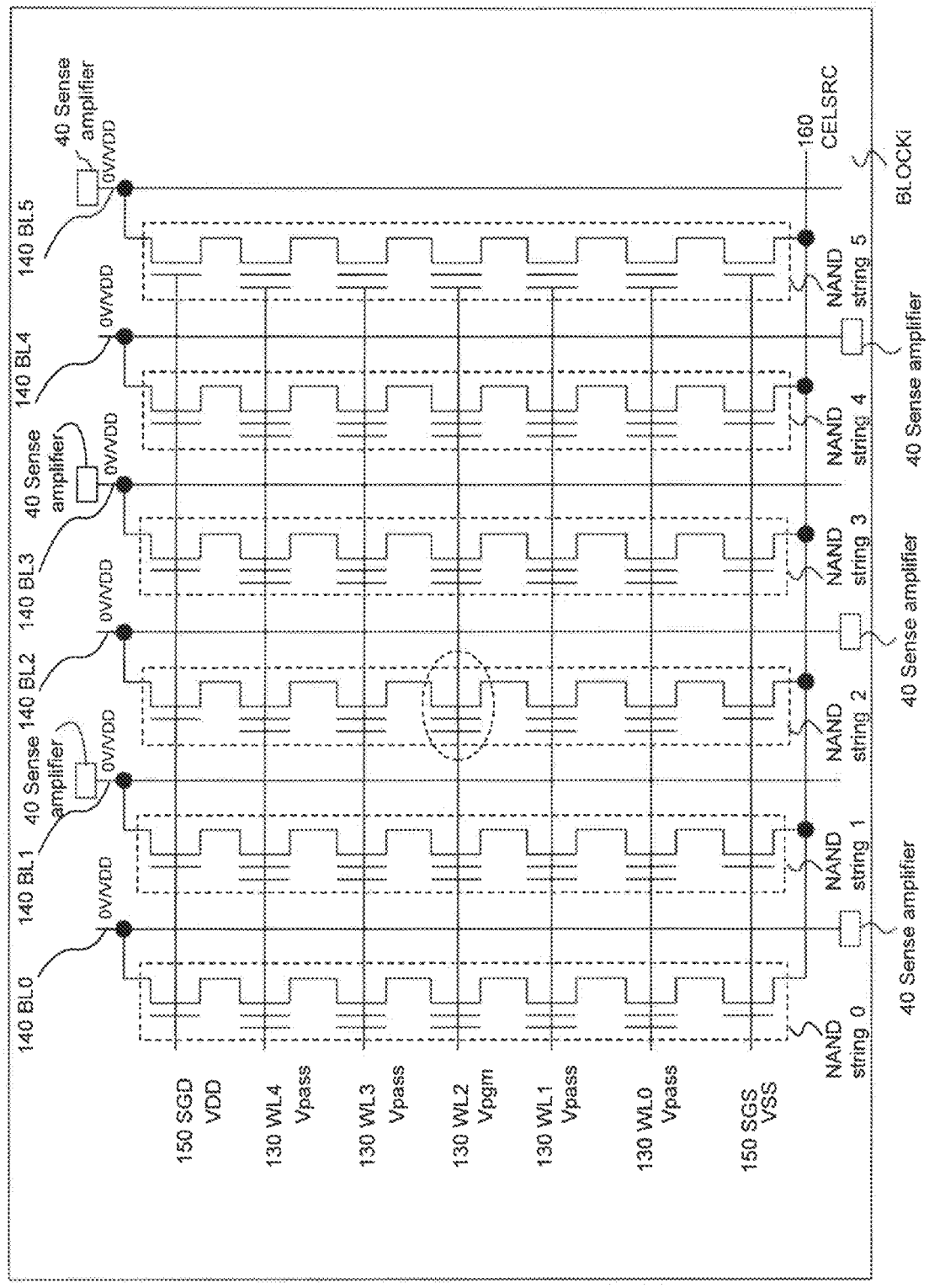
FIG. 5 shows the voltage relationship at the time of programming in a memory cell block BLOCKi shown in FIG. 3.
Figure 6:
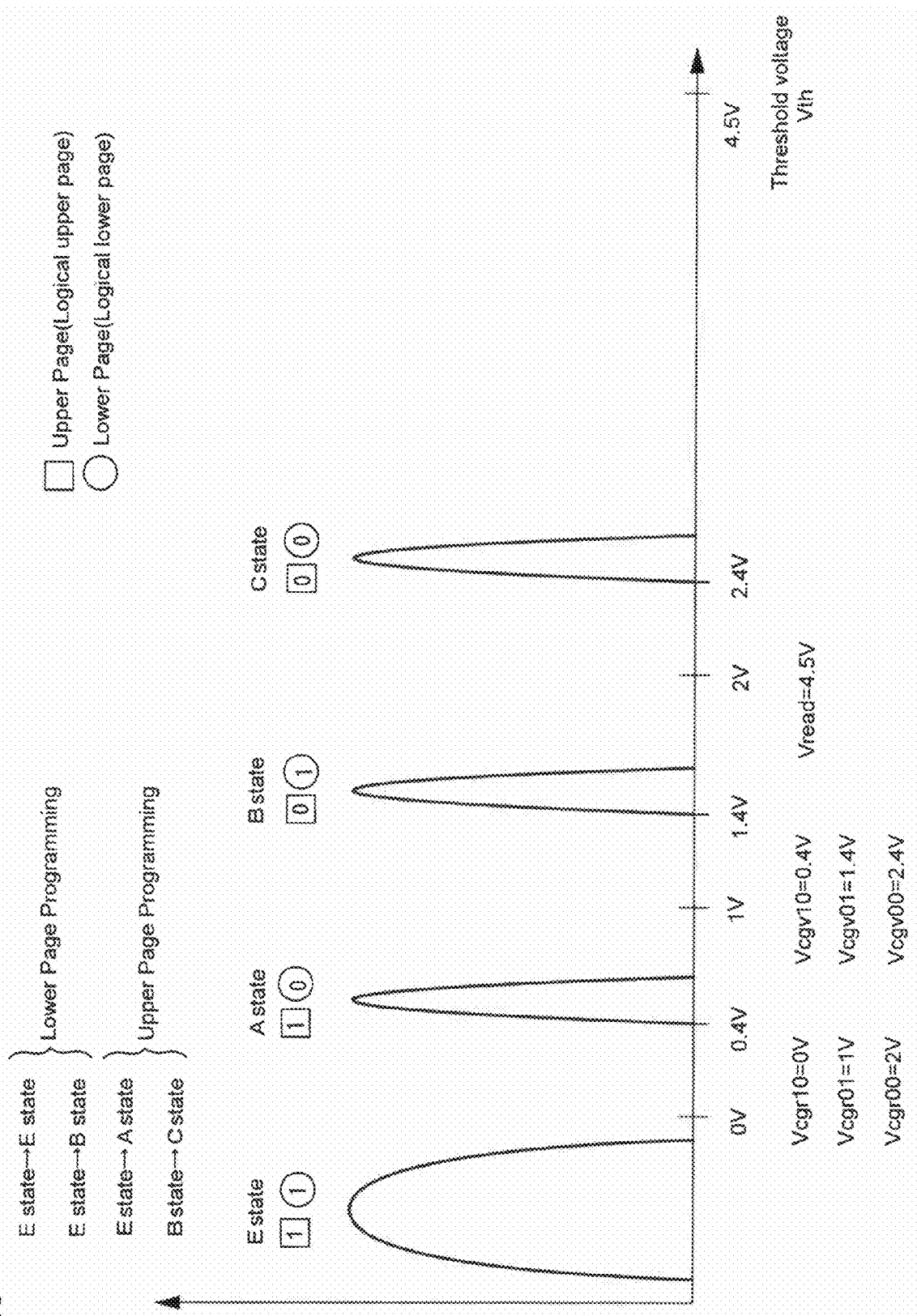
FIG. 6 shows the threshold voltage relationship of four-levels data.

FIG. 5 is a drawing which explains the voltage relationship at the time of programming in a memory cell block BLOCKi shown in FIG. 3. FIG. 6 is a drawing which shows the relationship between four-levels data and a threshold voltage. Programming, erasure and reading of multi-levels data, and the case when word line WL2 and bit line BL2 are selected will be explained based on FIG. 5. Here, the case where four-levels data (2 bits data) is stored in a memory cell will be explained as an example. Programming data is given as [(0) (programming)] and [(1) (non-programming)] and the four-levels data when combined with the programming data is [11], [10], [01] and [00]. [11] is in an erasure state and [10], [01] and [00] are in a programming state. This is expressed as [11] is an E state, [10] is an A state, [01] is a B state and [00] is a C state as shown in FIG. 6. 1 bit from the four-levels data (2 bits data) is stored in a memory cell as Lower_Page data and the other 1 bit is stores in the same memory cell as Upper_Page data.

In the case of controlling programming and reading of four-levels data, one negative threshold voltage which is an erasure state is allotted and three positive threshold voltages which are a programming and reading state are allotted. The positive threshold voltage is usually allotted between 0V-5V and while mutually taking a margin, is generally stepped up at a fixed proportion. Here, as an example, 0V is allotted to a programming state [10], 1V is allotted to a programming state [01] and 2V is allotted to a programming state [00].

In an initial state, a memory cell is in a [11] state. Also, in an erasure operation, a cell p well (C-p-well) is made 20V and all the word lines WL0, WL1, WL2, WL3 and WL4 (130) within a selected block are made 0V. In this way, electrons are released from a floating gate in the memory cells with this selected block and the memory cells become a [11] state.

At the time of erasure, the word lines 130 within a non-selected block, all the bit lines 140, control gates and source lines 160 are in a floating state. As a result, the voltage of the control gate lines rises to about 20V due to capacity coupling with the cell p well (C-p-well). Because the bit lines 140 and the source lines 160 become forward bios at a p well and N$^+$ at the PN junction of a diffusion layer, a voltage is supplied from the p well and rises to about 20V.

Programming is performed by applying 14V-20V as a programming voltage Vpgm to the selected word line WL2 (130). Because the selected bit line BL2 (140) is set at 0V, in the selected memory cells which are connected to these selected word lines WL2 (130) and bit lines BL2 (140), electrons are injected into the floating gate electrode and the threshold voltage rises rapidly (first step programming).

When the threshold voltage of a selected memory cell rises to near a desired level, because the threshold voltage of that selected memory cell is fixed at near the desired level and the speed in the rise of the threshold voltage should be controlled, the selected bit line BL2 (140) is increased to about 0.4V (second step programming).

Because this threshold voltage is forbidden to raise in non-selected memory cells, the bit lines BL0, BL1, BL3 and BL4, are applied with Vdd (3V for example), (programming forbidden).

Reading is performed by applying the selected word line WL2 with 0V, 1V or 2V as a read voltage. At this time, when the threshold voltage of the selected memory cell is lower than the read voltage, the bit line BL2 (140) and the source line 160 are shunted and the voltage of the bit line BL2 (140) becomes a low level [L]. Alternatively, when the threshold voltage of a selected memory cell exceeds the read voltage, because the bit line BL2 (140) and the source line 160 are non conductive, the voltage of the bit line BL2 (140) becomes a high level [H].

By setting a read voltage to 0V it is determined whether a memory cell is in a [11] state or a [10] state or a different state (10 read). Next, the memory cell is determined to have a state other than [11] is set with a read voltage of 1V. In this way, it is possible to determine a memory cell which is in a [10] state and a memory cell which is in a different state, that is [01] state or [00] state (01 read). Furthermore, by supplying with a read voltage of 2V to memory cells which are determined to be in a [01] state or to be in [00] state, it is possible to judge whether a memory cell is in a [01] state (00 read). Remaining memory cells which have not been judge by the above results are determined to be in a [00] state.

The lower limit of the threshold distribution of a memory cell which is in a [10] state, for example, is set at a read margin of 0.4V or more against a read voltage of 0V [10 read]. Whether the threshold voltage of all the memory cells in a [10] state is 0.4V or more, is verified by applying Vcgv10 (=0.4V) as a verify voltage to the selected word line 130 by [10 programming verify]. Then, a programming forbidden is applied to a memory cell in which the threshold voltage has reached 0.4V and a rise in the threshold voltage is forbidden.

Similarly, the lower limit of the threshold distribution of a memory cell which is in a [01] state, in the present example, is set at 1.4V and the lower limit of the threshold distribution of a memory cell which is in a [00] state is set 2.4V in the present example. Also, verification takes place by [01 programming verify] and [00 programming verify] and then, a programming forbidden voltage is applied to a memory cell in which the threshold voltage has reached the desired level or more and a rise in the threshold voltage is forbidden.

Here, it is effective to perform a two step programming verify to narrow the width of the threshold distribution. A two step programming verify is a verify in which two kinds of verify voltage levels, a normal level and a level lower than the normal level are prepared and a programming verify is executed using these two kinds of verify voltage. For example, in a [10 programming verify], first, 0.2V is applied to the selected word line WL2 as a verify voltage Vcgv10 and a 10 first step programming verify is performed. Then, 0.4V is separately applied as a verify voltage Vcgv10 to a memory cell in which the 10 first step programming verify is completed and then a 10 second step programming verify is performed.

Similarly, in a [01 programming verify] 1.2V [01 first step programming verify] is used and 1.4V [01 second step programming verify] is used as a verify voltage Vcgv 01 and in a [00 programming verify], 2.2V [00 first step programming verify] is used and 2.4V [00 second step programming verify] is used as a verify voltage Vcgv00.

In the case where the threshold voltage of a memory cell does not reach a verify voltage, because the bit line BL2 (140) and the source line 160 are shunted, the voltage of the bit line BL2 (140) becomes a low level [L]. When the threshold voltage of a memory cell exceeds the verify voltage, because the bit line BL2 (140) and the source line 160 become non conductive, the voltage of the bit line BL2 (140) becomes a high level [H].

In a multi-levels flash memory, n bits (n is a plurality) or $2^n$ level data is stored in one memory cell. Therefore, as the threshold distribution of a memory cell it is preferred that it is sharp and narrow. In order to obtain this kind of sharp and narrow threshold distribution, the following programming and threshold control method is adopted in the semiconductor memory device related to the first embodiment of this invention.

The programming voltage Vpgm is stepped up by a fixed proportion voltage Dvpgm (for example, 0.2V) from an initial level. The program voltage Vpgm is applied to a memory cell as a pulse signal (programming pulse) and every time the pulse signal is applied to a memory cell, the voltage only rises by that height (programming voltage vpgm).

When 0V is applied to a bit line which is connected a memory cell to be programmed, after a plurality of pulse signals has been applied, the threshold voltage of that memory cell rises at the same rising ratio (0.2V/pulse) as the rising ratio of the programming voltage Vpgm.

After programming using a pulse signal a programming verify is performed. In the programming verify, the voltage of the bit line which is connected to a memory cell in which the threshold voltage reaches a programming verify voltage is set as Vdd (power voltage). In other words, whether programming is finished in each cell is verified and the memory cell in which programming is finished is separately set as a programming forbidden state. According to this kind of programming and threshold voltage control method, it is possible to control the width of the threshold distribution to about the same rising ratio as the threshold voltage per one pulse, that is, 0.2V.

Figure 7:
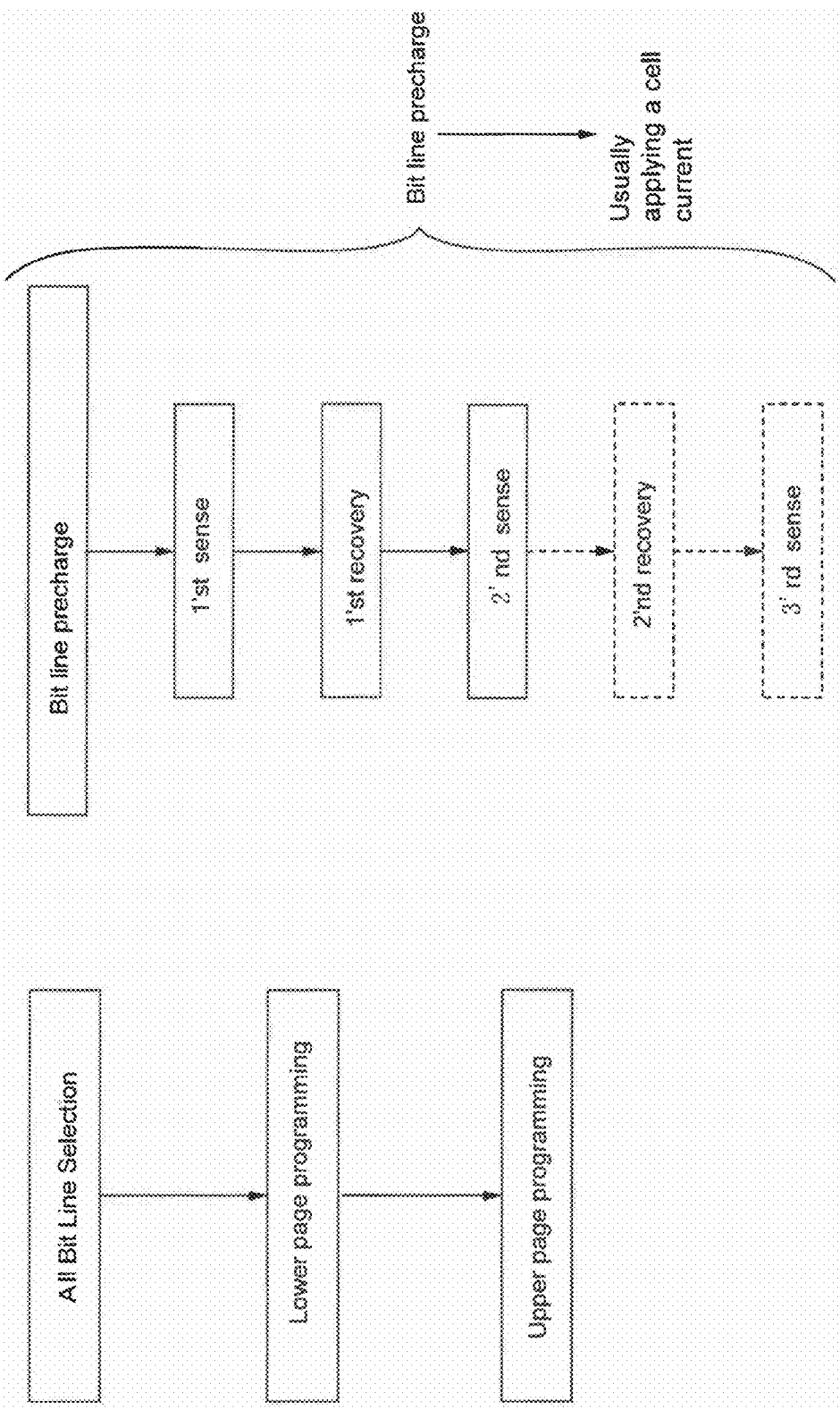
FIG. 7 shows a programming sequence in the nonvolatile semiconductor memory device relating to one embodiment of this invention.
Figure 8:
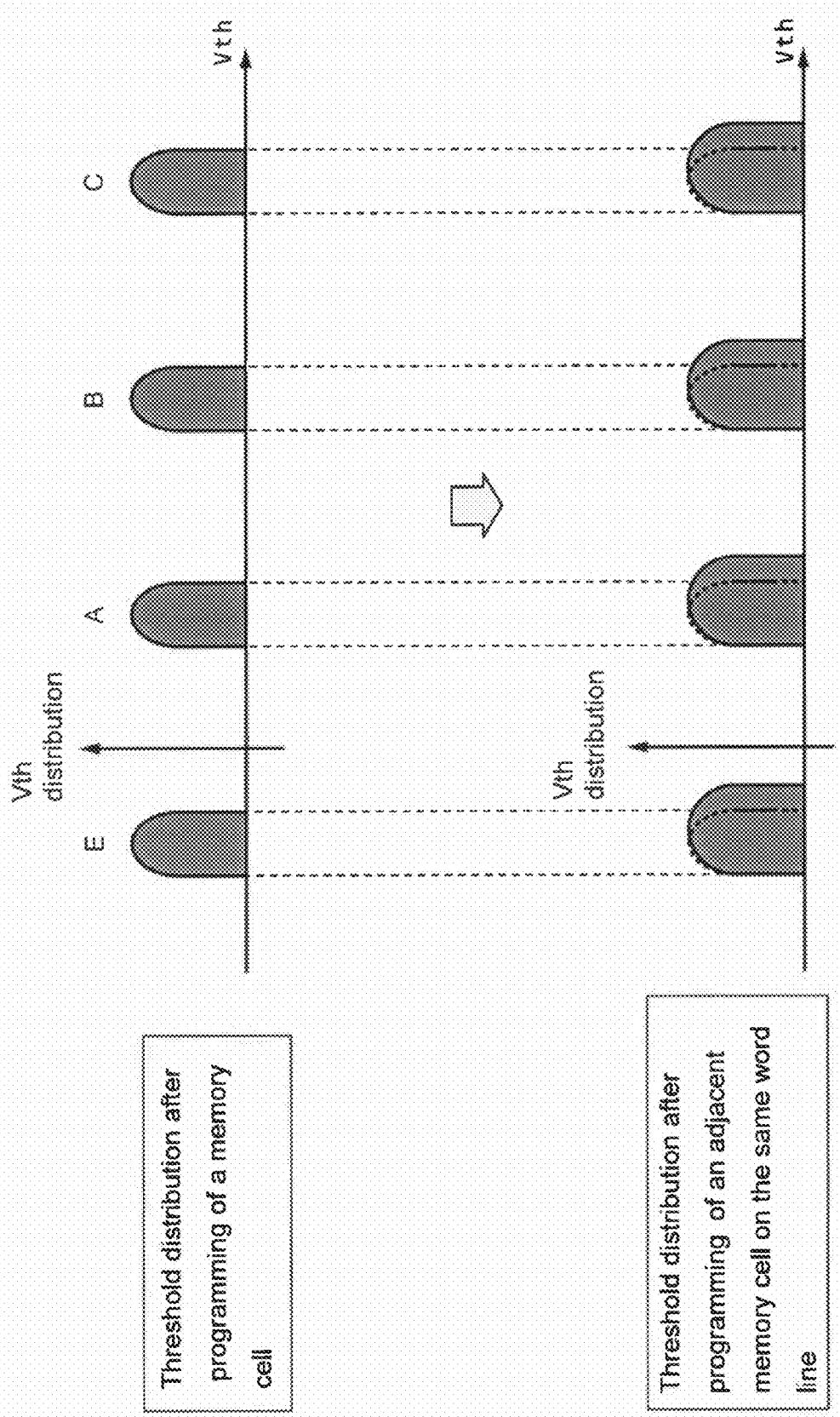
FIG. 8 is a typical characteristic of the threshold distribution which shows the influence of capacitive coupling of a NAND type cell.

The consecutive programming sequence is represented as in FIG. 7. FIG. 7 shows a programming sequence (FIG. 7a) and reading method (FIG. 7b) of the nonvolatile semiconductor memory device related to the first embodiment of this invention. Also, FIG. 8 is a typical threshold distribution which shows the influence of capacitive coupling of a NAND type cell. As a way of programming, there are many ways, however, in order to simplify explanation it is programmed in the order from an E state to an E state or A state, also, an E state to a B state or an A state to a C state. In this case, the former programming (from an E to an E or A) is called LOWER PAGE programming and the later programming (from an E to a B or from an A to a C) is called UPPER PAGE programming.

First, programming data as to whether to program (0 data) or not to program (1 data) is applied to the all the bit lines BL0-BL4 (140). In the case of 2 bits (four-levels) data, there are four Vth distribution states, as shown in FIG. 8.

First, in order to program, all the bit lines BL0-BL4 (140) are selected. A programming voltage 0V or a non-programming voltage VDD is applied to these bit lines BL0-BL4 (140). Following this, LOWER PAGE programming is performed and then UPPER PAGE programming is performed. The above is the consecutive programming sequence. With regards to reading, the bit lines BL0-BL4 (140) are precharged and a first sense, a first recovery, a second sense, a second recovery and a third sense are performed. Performing a plurality of recoveries in this way is to eliminate the effects of the source line 160 noise by throughput current because all the bit lines 140 have one sense amplifier 40 and a current is usually flowing. However, the number of recoveries is not limited to this and may basically be even one.

Figure 9:
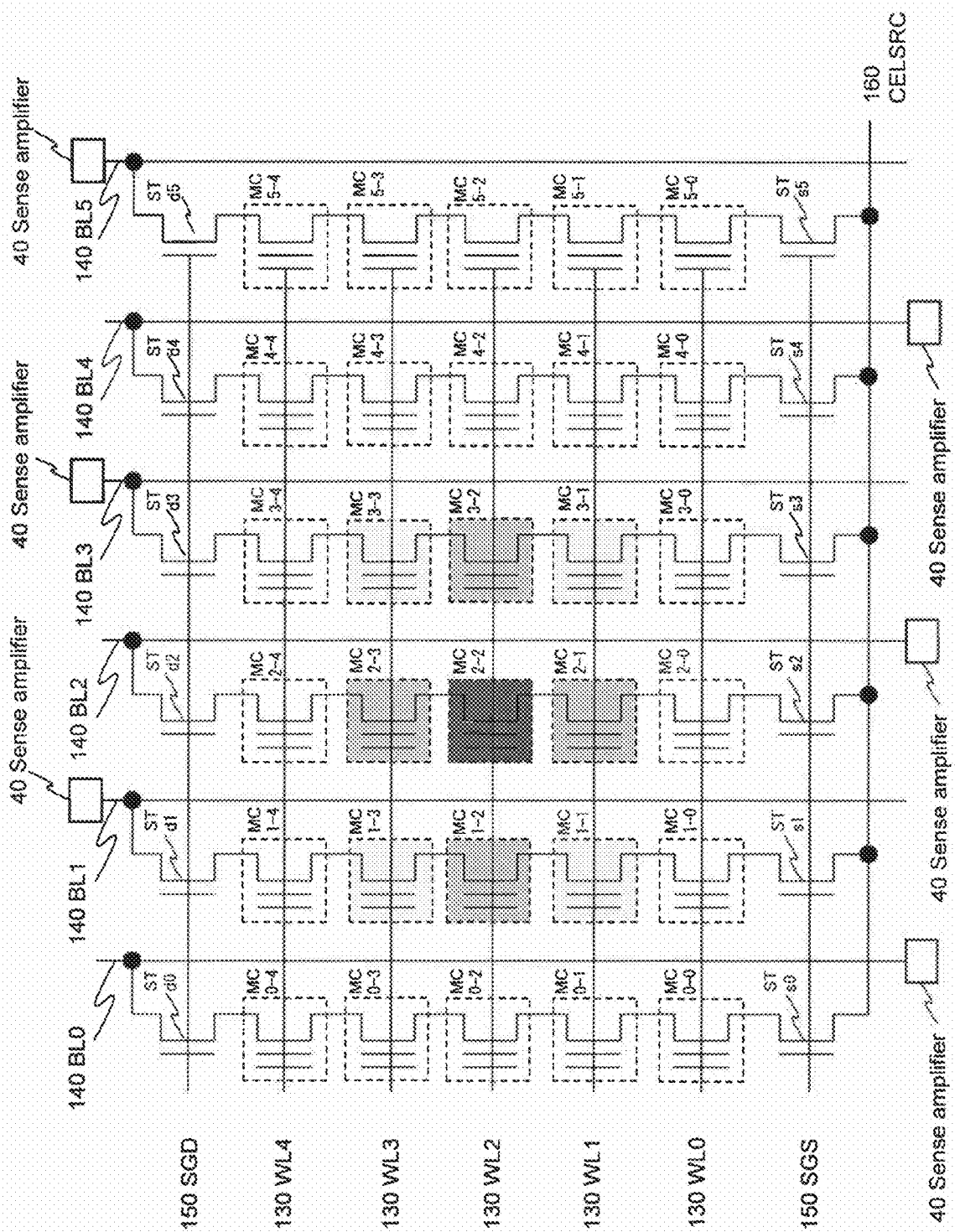
FIG. 9 shows the influence of capacitive coupling of a NAND type cell in the nonvolatile semiconductor memory device relating to one embodiment of this invention.

In the case of programming 2 bits (four-levels) data, the above stated programming sequence is used, however, the problem here is the influence of capacitive coupling of an adjacent cell. FIG. 9 is a typical drawing which shows the influence of capacitive coupling of a NAND type cell.

The floating gate of each memory cell 111 each has capacitive coupling with the floating gates of adjacent memory cells 111 in a bit line direction, word line direction and diagonal direction. The floating gate of the memory cell MC2-2 shown in FIG. 9 has capacitive coupling with the adjacent memory cells MC1-1, MC1-2, MC1-3, MC2-1, MC2-3, MC3-1, MC3-2 and MC3-3. However, the capacitive coupling of the adjacent memory cells MC2-1, MC2-3 in a bit line direction and the adjacent memory cells MC1-2, MC3-2 in a word line direction is larger than the capacitive coupling of the adjacent memory cells MC1-1, MC1-3, MC3-1 and MC3-3 in a diagonal direction. Therefore the influence of capacitive coupling in these directions becomes greater. Alternatively, although the memory cells MC1-1, MC1-3, MC3-1 and MC3-3 in a diagonal direction have capacitive coupling their influence is small.

In the case where a consecutive programming sequence shown in FIG. 7 is assumed, the form of the influence of capacitive coupling appears is as shown in FIG. 8. In FIG. 8, a typical drawing shows the distribution of a threshold voltage in the case where a memory cell adjacent on the same word line 130 and a memory cell adjacent on the same bit line 140 are programmed, using a memory cell which is connected to one word line 130 as an example. The memory cell MC2-2 in FIG. 9 is used an example for the purposes of explanation.

In the nonvolatile semiconductor memory device 10 related to one embodiment of the present invention, programming is performed in the following order, from the word line WL0 (130), the word line WL1 (130) and the word line WL2 (130). The word line WL1 (130) and all the bit lines BL0-BL4 (140) are selected and when a programming voltage is applied, the memory cell MC2-1 which is adjacent to the memory cell MC2-2 is programmed. The memory cell MC2-2 has capacitive coupling with the memory cell MC2-1, however, because the memory cell MC2-2 is not yet programmed there is no influence. Next, the word line WL2 (130) and all the bit lines BL0-BL4 (140) are selected and a programming voltage is applied. At this time, the threshold distribution of the memory cell MC2-2 becomes the state in the upper part of FIG. 8. At this time, the memory cell MC2-2 is adjacent to the memory cells MC1-2 and MC3-2 on the same word line WL2 (130) and has capacitive coupling. However, because they are programmed simultaneously, the influence of capacitive coupling between memory cells in the same word line 130 direction becomes smaller when compared to the influence of capacitive coupling between memory cells in the same bit line 140 direction. Next, the word line WL3 (130) and all the bit lines BL0-BL4 (140) are selected and a programming voltage is applied. At this time, the memory cell MC3-2 which is adjacent to the memory cell MC2-2 is applied with a programmed. Because the memory cell MC2-2 has capacitive coupling with the memory cell MC3-2, the threshold distribution of the memory cell MC2-2 becomes the state shown in the lower part shown in FIG. 8. The threshold distribution becomes wider due to the influence of capacitive coupling.

In other words, this is because a shift in the threshold voltage of the memory cell can be seen at the time of read by the influence caused by the change in the amount of charge of the floating gate by programming of a memory cell adjacent on the same bit line 140 when a memory cell of a page is programmed after an adjacent page has been programmed. Because this influence depends on the threshold voltage of a programmed adjacent cell the threshold distribution does not widen uniformly as accurately as that shown in the drawing, however, in the case where an adjacent memory cell is programmed, the width of the threshold distribution of the original memory cell always widens.

Therefore, in the nonvolatile semiconductor memory device which stores by multi-levels, because a plurality of levels are programmed in one memory cell the number of programming synergistically increases. As a result, by narrowing the threshold distribution as much as possible, a margin is taken for the shift in the memory cell with regards to the reliability of data retention and read disturb (stress shift caused by the application of a read voltage). However, the threshold distribution becomes wider due to capacitive coupling of an adjacent memory cell as stated above and a margin for reliability is reduced by miniaturization.

The widening of this threshold voltage can be reduced by making the width of a programming voltage step up smaller and programming. However, in the case where the step up width is simply made smaller, the number of times a programming voltage is applied increases, the entire programming time becomes longer and programming speed drops and thus is not practical. Therefore, while reducing the drop in programming speed, reducing the widening of this threshold distribution is becoming an important technological issue in the progress of multi level programming.

In the present invention, in the nonvolatile semiconductor memory device 10 of the present invention in which each one sense amplifier 40 is connected to all the bit lines as high speed processing is demanded, the amount of data which is stored in a memory cell is allocated to every one word line 130 in units of one word line 130. Then, once the amount of data to be stored is allocated, programming to a memory cell is performed in word line units in page programming order. That is, based on the address of the memory cell, each memory cell is allocated as a memory cell which stores a small amount of data and a memory cell which stores more data than the memory cell which stores data with a small amount of information for every other word line 130 and operated. Therefore, in word line 130 units, all the memory cells which are connected to the same word line 130 store the same amount of data. In the entire nonvolatile semiconductor memory device 10, because the amount of data stored in a memory cell is allocated in a striped shape in a ROW direction (word line WL direction), the following allocation method is called a row stripe shape allocation method.

Figure 10:
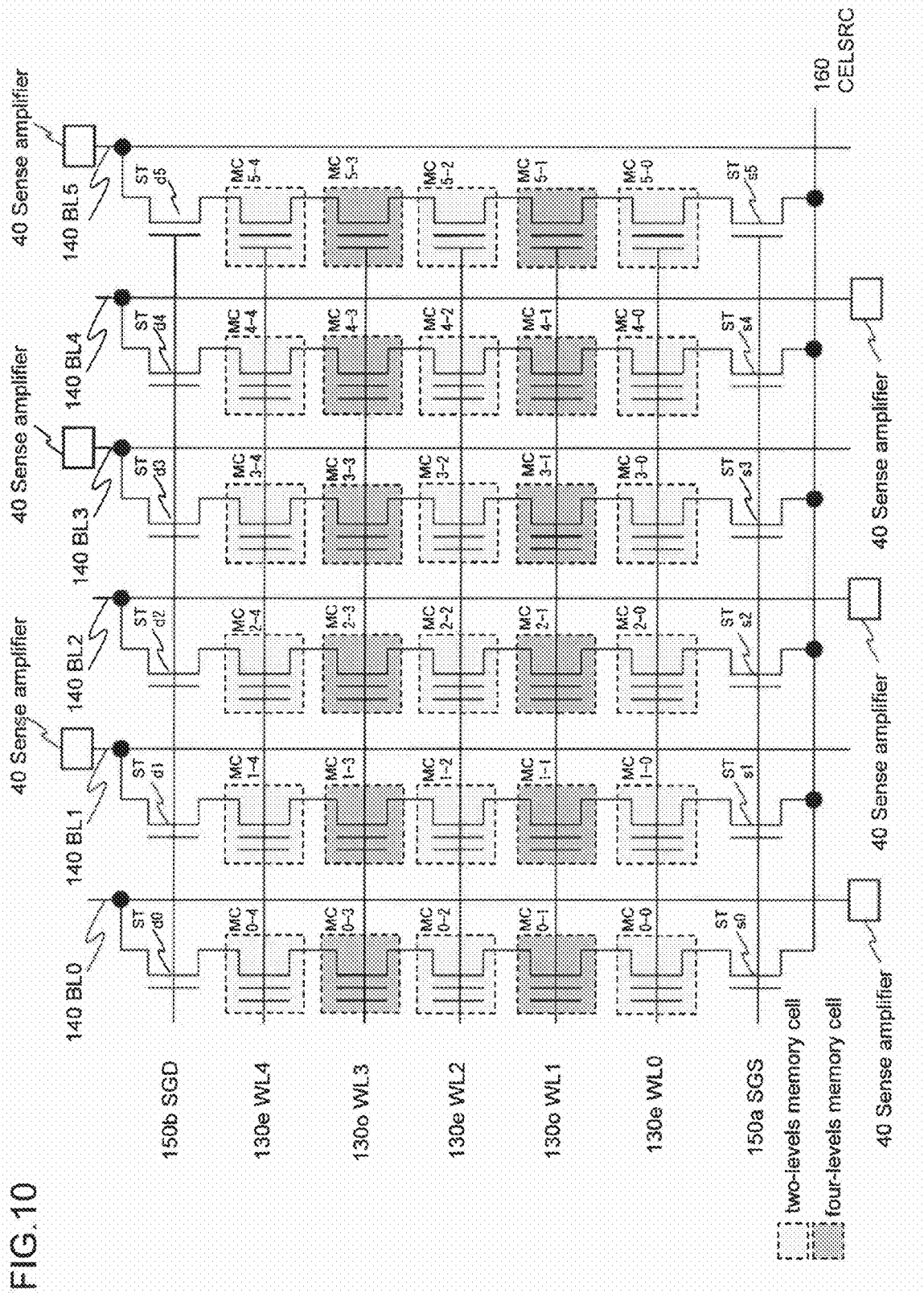
FIG. 10 is a typical characteristic of the allocation of two-levels data and four-levels data to a memory cell in the nonvolatile semiconductor memory device relating to one embodiment of this invention.

FIG. 10 is a typical drawing of the allocation of an amount of data to be stored in a memory cell in the nonvolatile semiconductor memory device 10 relating to the first embodiment of the present invention. The present embodiment is an example of the allocation of each memory cell between memory cells which store two-levels data and memory cells which store four-levels data in word lines 130 units. Specifically, in the case where all the memory cells which are connected to a specific word line 130 are allocated so that two-levels data is stored, all the memory cells which are connected to the word lines 130 which are adjacent on both sides of the this specific word line 130 are allocated so that four-levels data is stored. This allocation is decided by a memory cell's address. In the first embodiment of the present invention, the word lines 130 are divided into even word lines 130e and odd word lines 130o and the memory cells are also divided between first group of memory cells which are memory cells connected to the even word lines 130e and second group of memory cells which are memory cells connected to the odd word lines 130o. Then, two-levels data is allocated to the first group of memory cells and four-levels data is allocated to the second group of memory cells.

Specifically, in FIG. 10, in the case where the memory cell MC2-2 which is included in the first group of memory cells, is allocated so that two-levels data is stored, the other memory cells on the same word line WL2 (130e) MC0-2, MC1-2, MC3-2, MC4-2 and MC5-2, are all allocated so that two-levels data is stored. Either the memory cell MC2-1 or MC2-3 which are adjacent on the same bit line BL2 (140), they are allocated so that four-levels data is stored. The other memory cells which are on the word line WL1 (130o) and WL3 (130o) which are connected to the memory cells MC2-1 and MC2-3 respectively, are all allocated so that four-levels data is stored.

Figure 18:
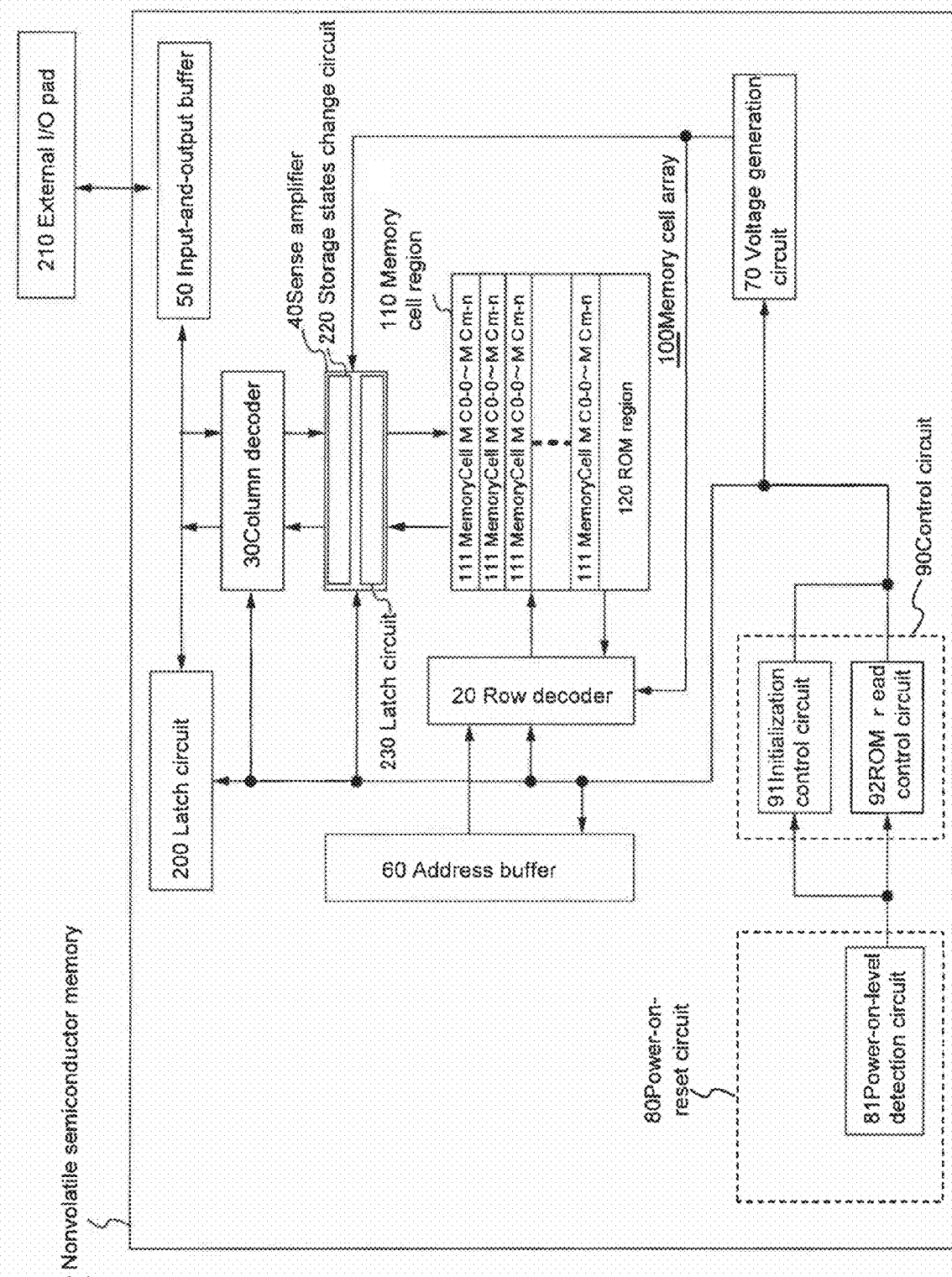
FIG. 18 is an outline construction of a nonvolatile semiconductor memory device relating to one embodiment of this invention.

This allocation, is decided in advance by the address of a memory cell as stated above, and is stored as fuse data in the ROM region 120 of the memory cell array 100 shown in FIG. 1. The ROM region 120 which stores the fuse data is called a ROM fuse. This fuse data is read from the ROM region 120 by a ROM read operation and is set in the latch circuit 200. And further, the sense amplifier 40 of the present invention has a corresponding storage states change circuit, as shown in FIG. 18. The storage states change circuit changes the number of storage states of each of memory cell transistors based on the fuse data. Therefore, in the first embodiment of the present invention, all the memory cells can be made memory cells which store two-levels data (below an operation mode which stores the storing of two-levels data is called two-levels cell mode and the memory cell MC which is allocated with a two-levels cell mode is called two-levels cell) and memory cells which store four-levels data (below an operation mode which stores the storing of four-levels data is called four-levels cell mode and the memory cell MC which is allocated with a four-levels cell mode is called four-levels cell) by the set fuse data. It is possible to use a two-levels cell mode, a four-levels cell mode or a two-levels and four-levels row stripe shape mixture mode by an operation mode switch.

Further, in this embodiment, a storage mode is allocated to all the memory cells by the ROM fuse, two fuse circuits may be arranged within the power on reset circuit 80, fuse data programmed corresponding to each address, the fuse data read immediately after power on and supplied to a delay circuit (not shown in the drawing). Also, it may be controlled by an external input.

Here, because there is a large influence on the chip operation when data which is unreadable occurs, a high level of reliability is demanded from the ROM region 120. Consequently, in the case where the memory cell region 110 stores multi-levels data such as four-levels data or eight-levels data or even in the case where four-levels data and eight-levels data are mixed, the ROM region 120 is basically allocated as a two-levels data region in order to guarantee reliability.

The programming sequence in the first embodiment of the present invention will be explained in detail based on FIG. 10. First, the word line WL0 (130e) is selected. Next, the all the bit lines 140 are selected and page programming is performed. In this case, because all the memory cells which are connected to the word line WL0 (130e) are first group memory cells and because they are allocated so that two-levels data is stored, two-levels data programming is performed.

When this programming is completed, next, the word line WL1 (130o) is selected, all the bit lines 140 are selected and page programming is performed. Because all the memory cells which are connected to the word line WL1 (130o) are second group memory cells and because they are allocated so that four-levels data is stored, four-levels data programming is performed. First, after LOWER PAGE programming is performed UPPER PAGE programming is performed.

The influence of capacitive coupling caused by programming of the memory cells which are connected to the word line WL1 (130o) reaches to the memory cells which are connected to the adjacent word lines WL0 (130e) and WL2 (130e). Here, all the memory cells which are connected to the adjacent word line WL0 (130e) are already programmed with two-levels data. Because the interval in the threshold distribution of two-levels data is wide, even if the width of the threshold distribution is widened a little by the influence of capacitive coupling, it is possible to absorb a margin for the shift of the threshold distribution. Therefore, the influence of capacitive coupling on the memory cells which are connected to the word line WL0 (130e) is absorbed. On the other hand, because all the memory cells which are connected to the word line WL2 (130e) have yet to be programmed, capacitive coupling does not occur.

Then, programming is performed to the memory cells which are connected to the word line WL2 (130e). The word line WL2 (130e) is selected and all the bit lines 140 are selected and programming is performed. In this case, because the memory cells which are connected to the word line WL2 (130e) are first group memory cells, two-levels data programming is performed.

Even in this programming, the influence of capacitive coupling reaches all the memory cells which are connected to the adjacent word line WL1 (130o), however, each memory cell is already programmed with four-levels data and because the threshold voltage of two-levels data is lower when compared to the threshold voltage of four-levels data, there is little influence of capacitive coupling to an adjacent memory cell. Therefore, each memory cell can absorb the influence of capacitive coupling.

Although selection and programming is performed in the order word line WL3 (130o), word line WL4 (130e), adjacent word lines 130 are always programmed with two-levels data and four-levels data. Therefore, as stated above, by making a memory cell which is adjacent to a four-levels cell in a bit line direction having a large capacitive coupling with the four-levels cell to a two-levels cell (that is, allocated so that two-levels data is stored in this memory cell) it is possible to reduce the shift influence of capacitive coupling in the four-levels cell. That is, at the time of programming a two-levels cell, because it is possible to set a read voltage of the non-selected word lines 130 lower than that of a four-levels cell, it is possible to reduce Read Disturb (a stress shift caused by the application of a read voltage). Also, at the time of programming a two-levels cell, because the threshold voltage shift is small, the influence of capacitive coupling of the adjacent memory cell is small. It is also possible to reduce the shift influence of capacitive coupling of a two-levels cell. That is, because a two-levels cell has a margin of the threshold distribution, even if four-levels data is programmed to an adjacent memory cell it is possible to absorb that influence. In the first embodiment of the present invention, it is possible to reduce the widening of the threshold distribution caused by interference of a memory cell which is adjacent to a memory cell which stores data with an amount of information of more than two-levels and it is possible to reduce the influence of capacitive coupling.

Also, in the first embodiment of the present invention, it is possible to make a mixed mode of two-levels and four-levels data. In this case, because half of the memory cell is a two-levels cell, it is possible to accelerate the programming speed over the entire cell faster than the case where the entire memory cell is a four-levels cell. Alternatively, when half of the cell is a four-levels cell, it is possible to increase the capacity of the entire memory. Therefore, it is possible to realize large capacity while attempting to increase speed.

Further, in the nonvolatile semiconductor memory device 10 related to the first embodiment of the present invention, an amount of data which is stored in a memory cell is allocated according to fuse data and because the programming sequence can be controlled, it is possible to satisfy to a plurality of demands within one memory chip. That is, in the case where programming speed is demanded it is possible to make the entire memory a two-levels cell mode by switching of the operation mode and use it as a high speed programmable memory. Alternatively, in the case where large capacity rather than high speed programming is demanded it is possible to make the entire memory a four-levels cell mode by switching of the operation mode and use it as a large capacity storage memory. Furthermore, in the case where either high speed programming or large capacity is demanded, by using a two-levels and four-levels cell mixture mode by switching of the operation mode these demands can be met. In addition, because it is possible to meet the needs of various users within the same memory chip, the production line can be made more efficient and it is possible to realize lower memory chip production costs.

In the first embodiment of the present invention, because the two-levels and four-levels mixed mode, as stated above, becomes an operation mode which continues to raise the level of programming performance and relieve the stresses of programming and reading, reliability is high. In the case where the reliability of the entire memory which is made a four-levels cell mode is low, it is effective for guaranteeing reliability in the same chip aimed at the high end market which emphasizes reliability and performance.

Figure 11:
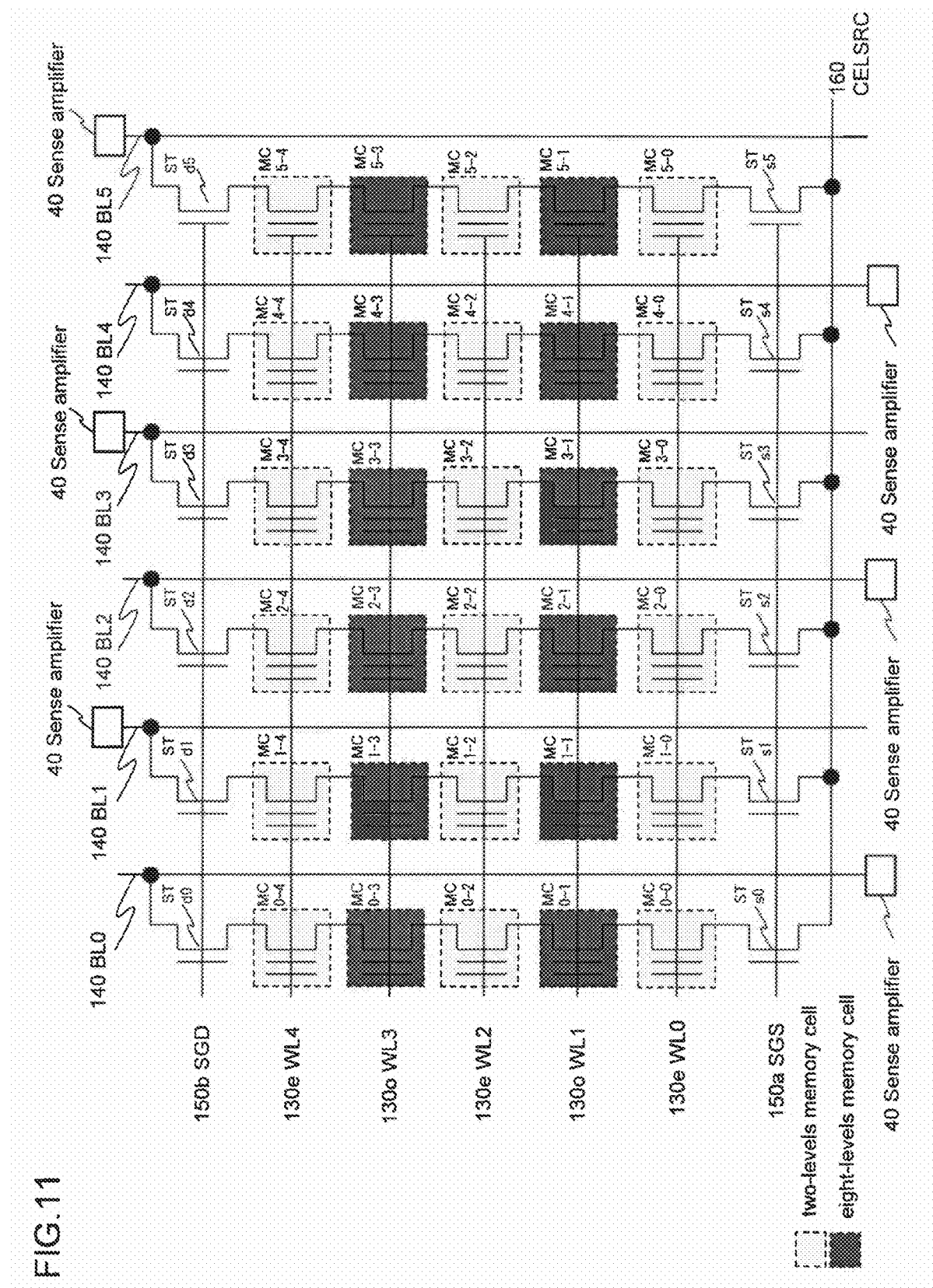
FIG. 11 is a typical characteristic of the allocation of two-levels data and eight-levels data to a memory cell in the nonvolatile semiconductor memory device relating to one embodiment of this invention.

In the nonvolatile semiconductor memory device 10 related to the first embodiment of the present invention, the data which a memory cell stores is not limited to two-levels data and four-levels data. It is possible to allocate other amounts of information. FIG. 11 is a typical drawing of the allocation of an amount of data which is stored in a memory cell in the nonvolatile semiconductor memory device 10 related to the first embodiment of the present invention. FIG. 11 is an example of the allocation of two-levels data and eight-levels data.

Specifically, the memory cell MC2-2 in FIG. 11 will be explained. In FIG. 11, the memory cells are allocated so that the first memory cell group which is connected to an even word line 130e stores two-levels data and the second memory cell group which is connected to an odd word line 130o stores eight-levels data. Therefore, the memory cell MC2-2 is allocated with two-levels data. Further, the allocation of data which a memory cell stores may be allocated so that the first memory cell group stores eight-levels data and the second memory cell group stores two-levels data. The allocation method of data which is stored in a memory cell is the same as the method described above. Therefore a detailed explanation will be omitted here.

In the case of controlling the programming and reading of eight-levels data, one level is allocated to a negative threshold voltage which is an erasure state and seven levels are allocated to a positive threshold voltage which are programming and reading states. The positive threshold voltage is set to between 0V-5V while stepping up at the same width from 0V. The setting of a read voltage which is used in a verify read is the same as the setting method in the case of four-levels data stated above. In addition, because the width of a threshold distribution is made narrow, performing the two step programming verification is the same as the case of four-levels data stated above and thus an explanation will be omitted here.

However, programming is different from programming the above stated four-levels data. That is, when programming data is given as [0 (programming)] and [1 (not programming)], eight-levels data is expressed as [111] which is an erasure state, and seven programming states, [110], [101], [100], [011], [010], [001] and [000], by combining with the above stated programming data. Among the eight-levels data (3 bits data), 1 bit is Lower Page data, 1 bit is Middle Page data and the other 1 bit is Upper page data, all of which are stored in the same memory cell. The above stated erasure state and seven programming states are programmed to a memory cell by three programming operations. That is, for example, after programming the above stated programming states of the four-levels data [E state (11)], [A state (10)], [B state (01)], [C state (00)] twice (Lower Page programming and Middle Page programming), the remaining programming step (Upper Page programming) is performed. This programming method is only an example and not limited to this example, other programming methods may be used.

Programming is carried in order from the word line WL0 (130e) which is close to the source line 160. After the word line WL0 (130e) is selected, all the bit lines 140 are selected and page programming is performed. All the memory cells which are connected to this word line WL0 (130e) belong to the first group of memory cells and are allocated so that they store two-levels data and then usual two-levels data programming is performed. Then, the word line WL1 (130o) is selected, all the bit lines 140 are selected and page programming is performed. All the memory cells which are connected to this word line WL1 (130o) belong to the second group of memory cells and are allocated so that they store eight-levels data. Therefore, after Lower Page data is programmed to all the memory cells which are connected to this word line WL1 (130o), Middle Page data is programmed. Further, Upper Page data is programmed. This programming is also controlled by the fuse data.

When page programming of eight-levels data is programmed to all the memory cells which are connected to the word line WL1 (130o), capacitive coupling occurs in all the memory cells which are connected to the word line WL0 (130e) where page programming has already been performed. Moreover, because eight-levels data is programmed, the number of times a programming voltage is applied while being stepped up increases dramatically compared to the programming of four-levels data. However, all the memory cells which are connected this word line WL0 (130e) are already programmed with two-levels data and because there is a margin for the threshold distribution of two-levels data programming, that influence can be absorbed. Therefore, it is possible to control a widening of the width of the threshold distribution caused by interference of an adjacent memory cell.

Then, the word line WL2 (130e) is selected and all the bit lines 140 are selected and page programming is performed. Because this word line 130e is an even word line, two-levels data is programmed. When this is programmed, capacitive coupling occurs in all the memory cells which are connected to the adjacent word line WL1 (130o). However, because this programming is two-levels data programming there is a small shift in the threshold voltage. Therefore, the influence of capacitive coupling given to an adjacent memory cell is small. That is, there is only a small widening of the threshold distribution of this memory cell.

Below, the word lines WL3 (130o), WL4 (130e) are selected in order and each is page programmed. Even in this programming, because the programming data is allocated alternately as two-levels data and multi-levels data (eight-levels data) for each word line 130, it is possible to reduce the influence of capacitive coupling in an adjacent memory cell. That is, in the nonvolatile semiconductor memory device 10 related to one embodiment of the present invention, even when the data which is stored in a memory cell is two-levels data and eight-levels data, it is possible to reduce the influence of capacitive coupling in an eight-levels cell with an adjacent memory cell in a bit line direction by a row stripe shape allocation and the above stated programming sequence. In addition, because it is possible to set a read voltage of the non-selected word lines 130 at the time of reading a two-levels cell lower than when reading an eight-levels cell, it is possible to reduce Read Disturb (the stress shift caused by applying a read voltage). Furthermore, regarding a memory cell which stores two-levels data, because there is a margin in the threshold distribution, even if eight-levels data is programmed to an adjacent memory cell in a bit line direction, it is possible to absorb the influence of capacitive coupling.

As explained above, in the nonvolatile semiconductor memory device 10 related to the first embodiment of the present invention, even in the case where two-levels data and eight-levels data are allocated as two kinds of data amounts which are stored in a memory cell, it is possible to reduce the interference of an adjacent memory cell caused by capacitive coupling between adjacent memory cells.

Furthermore, in the nonvolatile semiconductor memory device 10 related to the first embodiment of the present invention, because half the memory cells are allocated so that two-levels data is stored, it is possible to guarantee a fixed programming speed. Therefore, it is possible to increase capacity while achieving high speed programming.

Furthermore, in the nonvolatile semiconductor memory device 10 related to the first embodiment of the present invention, because it is possible to change the two kinds of data amounts which are stored in a memory cell to a two-levels cell mode, an eight-levels cell mode and a two-levels and eight-levels mixed mode, it is possible to satisfy to a plurality of demands within one memory chip and it is possible to propose a low cost memory chip with a high level of reliability.

Furthermore, when handling sixteen-levels data, the influence of capacitive coupling of an adjacent memory cell becomes more severe. This is because there is a need to program four times in the case of sixteen-levels data and the number of times a programming voltage is applied while stepping up increases significantly. Also, together with this, there is a significant drop in programming speed. However, the nonvolatile semiconductor memory device 10 related to the first embodiment of the present invention is still able to demonstrate good effects despite the above. That is, because the amount of data which a memory cell stores is allocated in a row stripe shape for each word line 130 and because the programming sequence is controlled, the memory cell which is adjacent in a bit line direction always stores a different data amount among two-levels data and sixteen-levels data.

Therefore, it is possible to reduce an influence caused by interference of an adjacent memory cell because of the above stated reason. In addition, in the case of a two-levels and sixteen-levels mixed mode, because half the memory cells are programmed with two-levels data and the half programmed with sixteen-levels data, it is possible to achieve large capacity while securing a fixed programming speed over the entire nonvolatile semiconductor memory device 10. Furthermore, because it is possible to allocate data which is stored as fuse data, it is possible to satisfy to a plurality of mode demands by changing this fuse data. Therefore, it is possible to change the same nonvolatile semiconductor memory device 10 according to a desired purpose, and propose a low cost nonvolatile semiconductor memory device 10 with a high level of reliability. As explained above, the nonvolatile semiconductor memory device 10 related to the first embodiment of the present invention is able to handle even more multi-bits data.

Second Embodiment

In the embodiment stated above, two kinds of data amounts which are stored in a memory cell were given as two-levels data and four-levels data or two-levels data and eight-levels data were made into two-levels data and multi-levels data and allocated in a row stripe shape for each word line 130. As stated above, in the case of storing multi-levels data in a memory cell, by making the step up width of a programming voltage smaller a threshold distribution can be narrowed and a plurality of threshold distributions are set between a non-selected read voltage and VSS. Therefore, the influence cause by capacitive coupling with an adjacent memory cell becomes larger because of a high threshold voltage caused by setting a plurality of threshold distributions. In other words, the greater the amount of data stored in a memory cell the higher the threshold voltage becomes, therefore, the large the influence of capacitive coupling. As a result, in the case of storing multi-bits of multi-levels data with a large amount of information to a memory cell, if the influence of capacitive coupling with this adjacent memory cell can not be reduced, a nonvolatile semiconductor memory device with high reliability can not be proposed.

In the second embodiment of the present invention, in the nonvolatile semiconductor memory device 10 in which one sense amplifier is arranged on each and every bit line 140, it is possible to store two different kinds of multi-bits of multi-levels data while reducing the influence of capacitive coupling. Specifically, in the second embodiment of the present invention, in the nonvolatile semiconductor memory device 10 in which one sense amplifier is arranged on each and every bit line 140, a memory cell stores two kinds of multi-bits of multi levels data and these two kings of data are allocated for each word line 130 in a row stripe shape. Then, at the time of programming, the device is controlled so that programming is performed on each word line in order from the word line WL0 (130e) which is close to the source line 160. Therefore, the memory cells which are adjacent on the same bit line 140 are stored with multi-bits of multi-levels data of different amounts and together with controlling the programming sequence it is possible to reduce the influence of interference of an adjacent memory cell. Therefore, it is possible to propose a multi-levels storage memory with high reliability.

Figure 12:
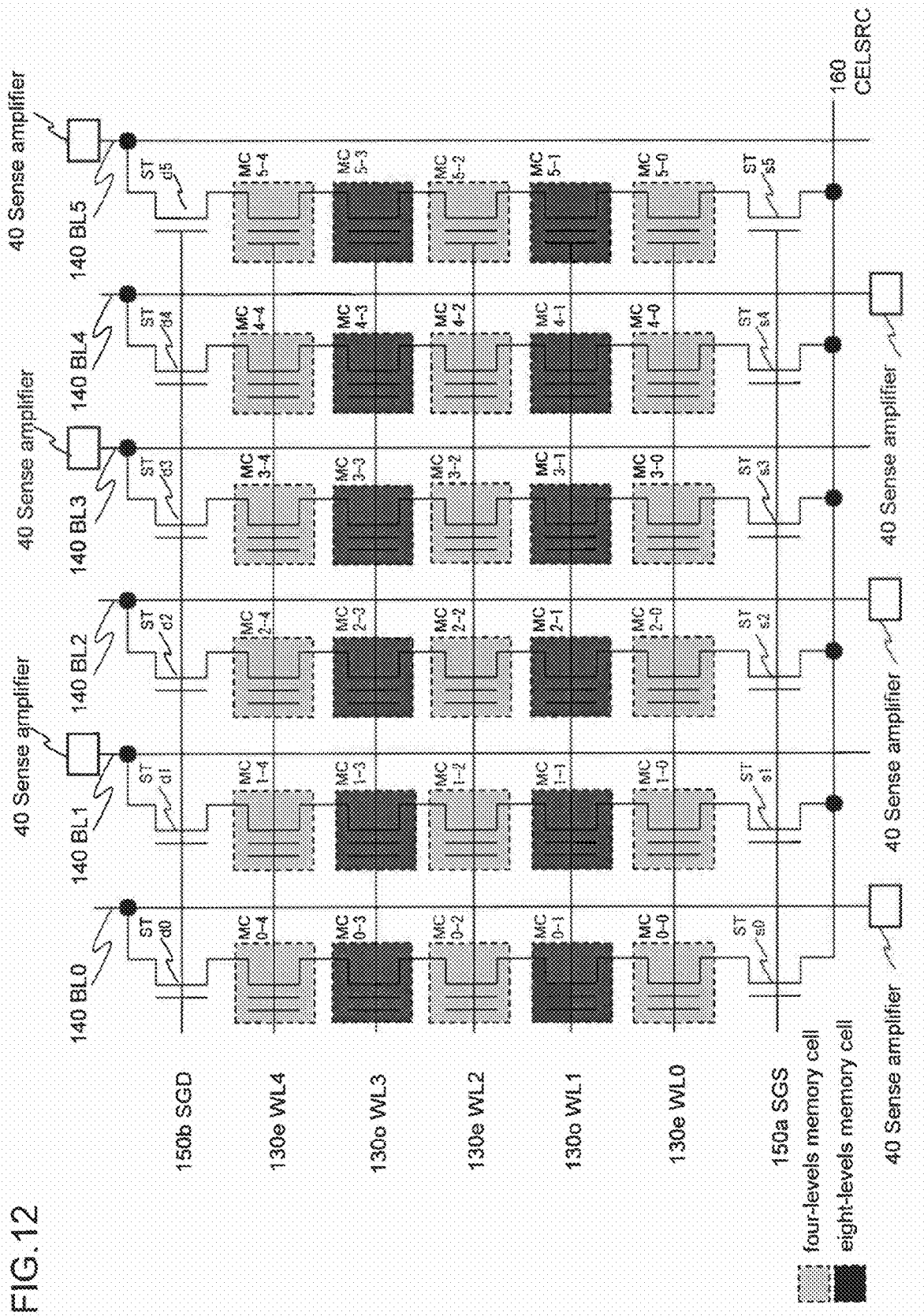
FIG. 12 is a typical characteristic of the allocation of four-levels data and eight-levels data to a memory cell in the nonvolatile semiconductor memory device relating to one embodiment of this invention.

Next, an explanation will be made based on the figures. FIG. 12 is a typical drawing of a memory cell allocation of the nonvolatile semiconductor memory device 10 related to the second embodiment of the present invention. The example in this embodiment illustrates a case where two kinds of multi-bits of multi-levels data which are stored in a memory cell are given as four-levels data and eight-levels data. In FIG. 12, the word lines 130 are divided into even word lines 130e and odd word lines 130o, the first group of memory cell which are connected to the even word lines 130e are allocated so that four-levels data is stored and the second group of memory cells which are connected to the odd word lines 130o allocates eight-levels data which is multi-bits of multi levels data of an amount larger than four-levels data. Eight-levels data may be allocated to the first group of memory cells and four-levels data may be allocated to the second group of memory cells.

This allocation is allocated in advance based on a memory cell address and is stored in a ROM fuse as fuse data. Then, the allocation data is read from a ROM region by a ROM read operation and set in a latch circuit 200. Of course, it is also possible by a method which arranges a fuse circuit within a power on circuit 80. In addition, it is also possible to set by switching an operation mode by an external input. This is the same as in the first embodiment of the present invention stated above.

Specifically, the memory cell MC2-2 in FIG. 12 will be explained as an example. The memory cell MC2-2 which belongs to the first group of memory cells is allocated so that it stores four-levels data and the second group of memory cells are allocates so that they store eight-levels data. Therefore, the memory cells MC2-1 and MC2-3 which are adjacent to the memory cell MC2-2 on the same bit line BL2 (140) are allocated so that eight-levels data is stored.

First, programming is performed in units of one word line 130. The word line WL0 (130e) is programmed and then the word lines WL1 (130o), WL2 (130e) are programmed in order. Next, the case of programming the memory cell MC2-2 will be explained. Before programming all the memory cells of the word lines WL2 (130e) to which the memory cell MC2-2 is connected, all the memory cells which are connected to word line WL1 (130o) which is adjacent to the word line WL2 (130e) are programmed. The word line WL1 (130e) is selected and then all the bit lines 140 are selected and programming is performed. Because the memory cells which are connected to this word line WL1 (130o) are first group memory cells, a programming sequence of eight-levels data is performed. Because there are eight-levels of data, a programming voltage is applied while being narrowly stepped up. At this time, because the memory cell MC2-1 which is adjacent to the memory cell MC2-2 on the same bit line BL2 (140) is programmed, the influence caused by interference of an adjacent memory cell reaches to the memory cell MC2-2. However, because this memory cell MC2-2 has not yet been programmed, no influence occurs.

Next, the word line WL2 (130e) is selected, and all the bit lines 140 which are connected to this word line WL2 (130e) are selected and the memory cell MC2-2 is programmed. Because the memory cells which are connected to this word line WL2 (130e) are first group memory cells, a programming sequence of four-levels data is performed. In the above programming, a programming voltage Vpgm is controlled so that it is stepped up at a fixed rate of Dvpgm (for example, 0.2V) from an initial value. At this time, capacitive coupling reaches to the memory cells MC2-1 and MC2-3 which are adjacent to the memory cell MC2-2 on the same bit line BL2 (140). However, because the memory cell MC 2-3 which is connected to the word line WL3 (130o) has not yet been programmed, no influence occurs. On the other hand, this influence also occurs in the memory cell MC2-1 which has already been programmed with eight-levels data. However, the memory cell MC2-2 is programmed with four-levels data. Therefore, because the number of applying programming voltages is fewer compared to programming eight-levels data, the stress on the memory cell MC2-1 which has already been programmed with eight-levels data is reduced. In addition, at the time of programming, because it is possible to set a read voltage of the non-selected word lines 130 lower than at the time of programming eight-levels data, it is possible to reduce Read Disturb. Therefore, interference to the memory cell MC2-1 from an adjacent memory cell can be reduced.

Next, the word line WL3 (130o) is selected, and all the bit lines 140 which are connected to this word line WL3 (130o) are selected and all the memory cells connected to this word line WL3 (130o) are programmed. Because the memory cells which are connected to this word line WL3 (130e) are second group memory cells, a sequence of eight-levels data programming is performed. At this time, eight-levels data is also programmed to the memory cell MC2-3 which is adjacent on MC2-2 on the same bit line BL2 (140). By this programming, the influence of capacitive coupling also reaches the adjacent memory cell MC2-2. However, because the memory cell MC2-2 is already programmed with four-levels data and because there is a margin in the threshold distribution, it is possible to absorb this influence. Therefore, it is possible to reduce interference of an adjacent memory cell. In this way, in the nonvolatile semiconductor memory device 10 related to the second embodiment of the present invention, even if the data which is stored in a memory cell is two kinds of multi-bits of multi-levels data, because the data is allocated so that memory cells which are adjacent in a bit line direction store different amounts of data and programming is controlled so that memory cells are page programmed in order in word line 130 units, it is possible to reduce a widening of the threshold distribution caused by interference of an adjacent memory cell.

Furthermore, in the nonvolatile semiconductor memory device 10 related to the second embodiment of the present invention, even in the case where two kinds of multi-bits of multi-levels data are allocated, for example, four-levels data and eight-levels data, as data which is stored in memory cells, because half of the memory cells are four-levels cells (a memory cell in which four-levels data is programmed), it is possible to increase programming speed over the entire memory compared to when eight-levels data is programmed to all the memory cells. Therefore, while realizing high speed programming it is possible to realize large capacity.

Furthermore, in the nonvolatile semiconductor memory device 10 related to the second embodiment of the present invention, because the allocation of an amount of data which is stored in a memory cell and programming order is controlled according to fuse data, it is possible to meet a plurality of demands within one chip by switching the fuse data. Therefore, it is possible to propose a low cost highly reliable memory chip. Further, the above stated effects are the same as in the first embodiment of the present invention.

Furthermore, when large multi-bits data, for example, sixteen-levels (4 bits data) is stored, the influence of capacitive coupling of an adjacent memory cell becomes even more severe. However in the nonvolatile semiconductor memory device 10 related to the second embodiment of the present invention, the above stated effects can still be demonstrated even in this case. That is, because an amount of data which is stored in a memory cell is allocated in a row stripe shape for every word line 130, memory cells which are adjacent in a bit line direction always store different amounts of data, four-levels data and sixteen-levels data. Therefore, it is possible to reduce the influence of capacitive coupling of an adjacent memory cell. In addition, because half of the memory cells are programmed with four-levels data, it is possible to secure a fixed programming speed across the entire nonvolatile semiconductor memory device 10 and guarantee high reliability. Furthermore, because the allocation of data which is stored is controlled by fuse data, it is possible to change the same nonvolatile semiconductor memory device 10 according to a desired purpose by changing this fuse data. Therefore, it is possible to propose a high quality low cost nonvolatile semiconductor memory device 10. The nonvolatile semiconductor memory device 10 related to second embodiment of the present invention can also store a greater amount of multi-bits data.

Third Embodiment

In the second embodiment of the present invention stated above, there were two kinds of multi-bits of multi-levels data which was stored in a memory cell and this data was allocated in a row stripe shape for each word line 130. Here, seven positive threshold voltages are required to control the programming and reading of eight-levels data. Therefore, because the more narrow the width of a margin with an adjacent threshold voltage, the more difficult control becomes, it is assumed that controlling variation of a threshold voltage of a cell when storing eight-levels data by voltage control technology is often difficult.

As a strategy in this case, two memory cells which are adjacent in a word line direction or bit line direction are paired and treated as if they are one memory cell, in what is called a virtual memory cell strategy. That is, conventionally, a number in multiples of two, two-levels (1 bit), four-levels (2 bits), eight-levels (3 bits), were used as amounts of data which are stored in a memory cell. However, for example, in the case where controlling variation of a threshold voltage of a cell when storing eight-levels data is difficult, data which exceeds four-levels data can not be stored and large capacity can not be achieved by multi-levels. Consequently, it is considered possible to achieve large capacity over an entire memory by using multi-levels data which can stably control a voltage using a data number other than a multiple of two and storing this data between two memory cells.

For example, according to a general method, it is possible to stably control a variation in the threshold voltage of a memory cell when storing four-levels data, however, in the case where it is not possible to stably control a variation in the threshold voltage of a memory cell when storing eight-levels data, four-levels data is stored in all the memory cells in order to secure maximum capacity and the storage capacity of one memory cell is 2 bits. However, it becomes difficult to control the influence of interference of an adjacent memory cell in the case of storing the same multi-levels data in all the memory cells. Consequently, it is effective to consider a virtual memory cell in which different amounts of data are stored in two adjacent memory cells and this data is stored as if it was single data. For example, in the case where two memory cells are considered as one virtual memory cell and three-levels data and six-levels data is stored, the amount of data becomes three-levels×six-levels=eighteen-levels>sixteen-levels (4 bits) and the storage capacity of one memory cell becomes 2 bits. Thus, while reducing the interference of an adjacent memory cell large capacity is realized. In this case, five positive threshold voltages are required for programming and reading six-levels data. However, in this voltage control because the width of the threshold distribution is wide but not sharp when compared to controlling seven positive threshold voltages in the case of eight-levels data, control is easy. Therefore, even if stable control of a variation of a memory cell's threshold voltage is difficult when storing eight-levels data, there are cases where it is possible to stably control a variation of a memory cell's threshold voltage when storing an amount of data less than eight-levels data, for example, six-levels data. In this case, it is effective to use a virtual memory cell. Furthermore, control of a three-levels data threshold voltage is easier than control of a four-levels data threshold voltage. In the third embodiment of the present invention, in the nonvolatile semiconductor memory device 10 in which one sense amplifier is arranged for each and all the word lines 140, two kinds of data with an amount of data other than a multiple of 2 are stored in one virtual memory cell. Next, these two kinds of data will be explained using three-levels data and six-levels data as an example.

Figure 13:
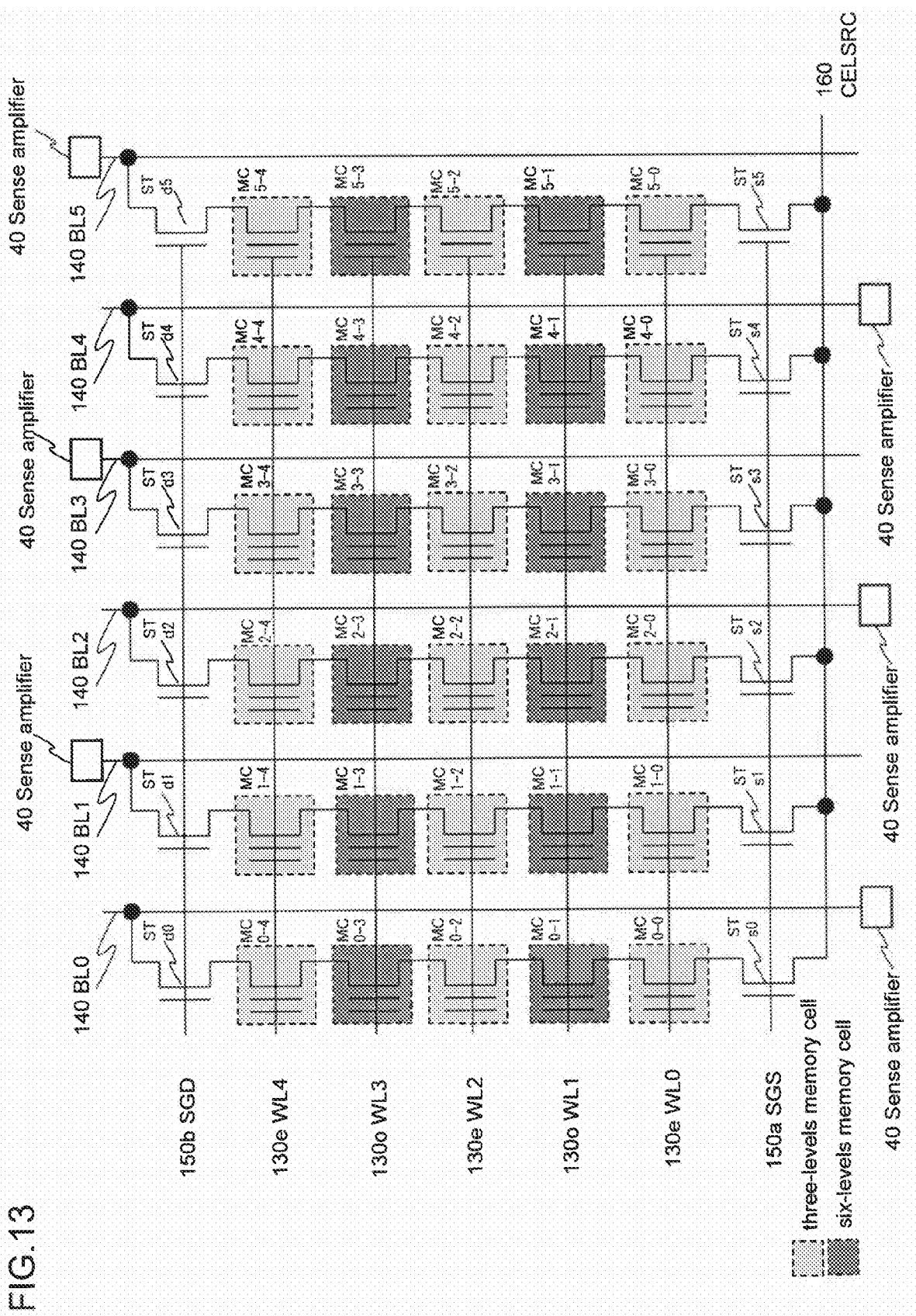
FIG. 13 is a typical characteristic of the allocation of three-levels data, and six-levels data to a memory cell in the nonvolatile semiconductor memory device relating to one embodiment of this invention.

FIG. 13 is a typical drawing of a memory cell allocation in the nonvolatile semiconductor memory device 10 related to the third embodiment of the present invention. In the present embodiment, data which is stored in a memory cell is allocated in a row stripe shape for each word line 130 and page programming is performed in order every other word line 130, the same as in the first and second embodiment of the present invention. In FIG. 13, data is allocated so that the first group of memory cells which are connected to an even word line 130e are stored with three-levels data and the second group of memory cells which are connected to an odd word line 130o are stored with six-levels data. In this way, a data with different amounts is stored in a pair of memory cells which are adjacent on the same bit line 140. Also, two memory cells which are adjacent on the same bit line 140 are allocated as a pair. For example, the memory cells which are connected to the same bit line 140 are allocated in pairs such as MC0-0 and MC0-1, MC0-2 and MC0-3. Next, the memory cells MC2-2 and MC2-3 will be explained as an example of a virtual memory cell. Furthermore, the allocation of an amount of data to be stored and a pair of memory cells will be based in advance on a memory cell address. Then, this allocated data is stored in a ROM fuse as fuse data and is read from a ROM region by a ROM read operation and set in a latch circuit.

This pair of memory cells MC2-2 and MC2-3 are not allocated with an actual address (below called a first address) but a virtual address (below called a second address). For example, a virtual page address m is allocated to the pair of memory cells MC2-2 and MC2-3.

By allocating this virtual page address it is possible to store multi-bits data to a virtual memory cell. That is, the memory cell MC2-2 is allocated so that three-levels data is stored and the memory cell MC2-3 is allocated so that six-levels data is stored. However, by treating these two memory cells as one virtual memory cell, it is possible to treat the memory cell MC2-2 as a first data page of this virtual memory cell and the memory cell MC2-3 as the second data page of this virtual memory cell. Also, a first data of input data which is calculated by a sense amplifier is stored in the first data page and a second data of this input data is stored in the second data page. Therefore, it is possible to store three-levels×six-levels=eighteen-levels>sixteen-levels (4 bits) in one virtual memory cell. As a result, while reducing interference of an adjacent memory cell, it is possible to realize large capacity over the entire memory.

Page programming to a virtual memory cell is performed on each word line 130. In a virtual memory cell m which consists of the memory cells MC2-2 and MC2-3 in FIG. 13, the word line WL2 (130e) is selected, the memory cell MC2-2 is programmed with first data programming then the word line WL3 (130o) is selected and the memory cell MC2-3 is programmed with second data programming.

First data is read from the first data page of the virtual memory cell and latched, second data is read from the second data page of the virtual memory cell and latched and the latched data is combined and determined.

As stated above in order to divide the input/output data between first data and second data and to program and read the data, the nonvolatile semiconductor memory device 10 related to the third embodiment of the present invention, has a plurality of latch circuits each of which is connected to a corresponding sense amplifier of the plurality of sense amplifiers and latches the data, and has a calculation circuit. The sense amplifier 40 judges whether the data which is stored in a memory cell at the time of a reading operation is [1] or [0], amplifies the data and externally outputs the amplified data via an input/output buffer 50. In addition, at the time of programming, the programming data is input to the sense amplifier 40 via the input/output buffer 50 and stored. Therefore, the data is read from the virtual memory cells and is latched in each of the latch circuits, and a real address (first address) and a corresponding virtual page address (second address) are provided to the data by the calculation circuit. However, this is an example and the nonvolatile semiconductor memory device 10 related to the third embodiment of the present invention is not limited to this. The real address and the corresponding virtual address can also be provided to the data by the control circuit.

Next, an example of a calculation of the input/output data which corresponds to an address using the memory cells MC2-2 and MC2-3 as an example will be explained. There are sixteen kinds of data which are stored in a virtual memory cell in the case of storing 4 bits data. A virtual page address m is specified and 2 digit data is externally input. 2 digit data shows first data of a virtual memory cell and 1 digit data shows second data of a virtual memory cell. The opposite may also be used.

This inputted data is calculated as three-levels data and six-levels data for each real address from the first data and second data of a virtual memory cell by the sense amplifier 40 shown in FIG. 1, and stored in this sense amplifier 40. That is, the calculated first data is allocated to the real address (first address) of the memory cell MC2-2 as three-levels data. Alternatively, second data is calculated as six-levels data to the real address (first address) of the memory cell MC2-3. However, because sixteen-levels data is converted to three-levels×six-levels=eighteen-levels data, sixteen-levels data is not allocated to two of this eighteen-levels data. Therefore, for example, 2 digit data [0] is allocated three-levels [00], [1] is allocated [01], [2] is allocated [10] and in 1 digit data [0] is allocated six-levels [000], [1] is allocated [001], [2] is allocated [010], [3] is allocated [011], [4] is allocated [100] and [5] is allocated [101]. According to this allocation, [02] of the inputted data becomes first data [00] and second data [010] of the virtual memory cell.

Programming of this [02] data is performed by programming [00] to the memory cell MC2-2 by programming first data to the virtual memory cell and [010] to the memory cell MC2-3 by programming second data to the virtual memory cell.

Reading the data is based on the following method. First, [00] is read as first data of the virtual memory cell from the memory cell MC2-2 which is one of the memory cells each having the first address corresponding to the second address of the virtual memory cell, and [00] is latched in the corresponding latch circuit. Second, [010] is read as second data of the virtual memory cell from the memory cell MC2-3 which is the other memory cell having the first address corresponding to the second address of the virtual memory cell. And then the first data latched in the corresponding latch circuit and the second data is logically operated as the data [02] of second address by the calculation circuit. Then the data [02] is outputted.

Programming is performed in the order first data programming then second data programming. The memory cell MC2-2 which is programmed with first data is allocated so that three-levels data is stored. Therefore, influence of an adjacent memory cell caused by capacitive coupling also reaches the memory cell MC2-3 which is programmed with second data. However, because this programming is three-levels data programming the number of applying programming voltages is few and therefore stress at the time of programming to a six-levels cell (a memory cell which is programmed with six-levels data) is reduced. In addition, because a read voltage of the non-selected word lines 130 can be set lower than that of a six-levels cell, it is possible to reduce Read Disturbance. Therefore, the influence of interference of an adjacent memory cell is small. In addition, because the memory cell MC2-3 which is programmed with second data is programmed with six-levels data, influence occurs on the adjacent memory cell MC2-2. However, this memory cell MC2-2 is already programmed with three-levels data which has a threshold distribution with a wide width and it is possible to absorb this influence. Therefore, the influence of interference of an adjacent memory cell is small. In the nonvolatile semiconductor memory device 10 related to the third embodiment of the present invention as stated above, the memory cells which are adjacent in a bit line direction are allocated so that different amounts of data are stored in each memory cell and because programming is controlled so that page programming is performed in order on each word line 130, it is possible to control the widening of a threshold distribution which is the cause of capacitive coupling.

Furthermore, in the nonvolatile semiconductor memory device 10 related to the third embodiment of the present invention, even if three-levels data and six-levels data is allocated as two kinds of data amounts which are stored in a memory cell, because half of the memory cells are programmed with three-levels data it is possible to achieve high speed programming and increase capacity.

Furthermore, in the nonvolatile semiconductor memory device 10 related to the third embodiment of the present invention, because an operation mode is switched by switching fuse data it is possible to meet a plurality of demands within one memory chip. Therefore, it is also possible to propose a low cost and highly reliable memory chip.

Furthermore, according to the nonvolatile semiconductor memory device 10 related to the third embodiment of the present invention, because it is possible to reduce the interference of an adjacent memory cell which is the cause of capacitive coupling, it is possible to store five-levels data or seven-levels data and even eleven-levels data two kinds of data amounts apart from multiples of 2. Below, five-levels data and seven-levels data and also six-levels data and eleven-levels data is explained as an example of two kinds of multi-levels data which are not multiples of 2.

Figure 14:
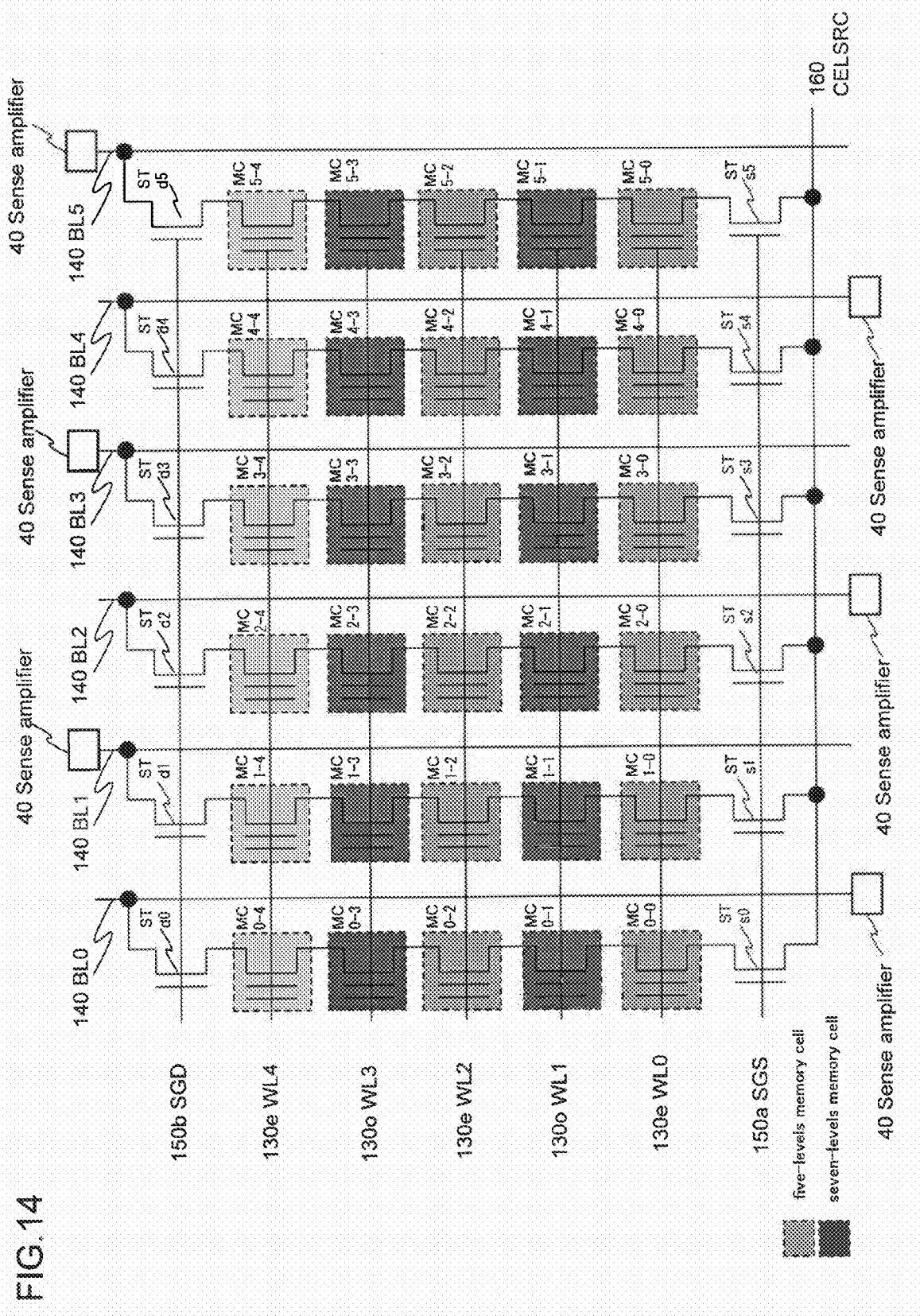
FIG. 14 is a typical characteristic of the allocation of five-levels data and seven-levels data to a memory cell in the nonvolatile semiconductor memory device relating to one embodiment of this invention.

An example which uses five-levels data and seven-levels data as two kinds of multi-levels data which are not multiples of 2 will be explained in detail based on FIG. 14. FIG. 14 is a typical drawing of the memory cell allocation in the nonvolatile semiconductor memory device 10 related to the third embodiment of the present invention. It is possible to stably control the variation in a memory cell's threshold voltage when storing four-levels data (2 bits data), however, in the case where it is difficult to control the variation in a memory cell's threshold voltage when storing eight-levels data (3 bits data), for example, there are cases where it is possible to stably control the variation in a memory cell's threshold voltage if five-levels data or seven-levels data is stored. This example is effective in this case.

In the present embodiment, the data which a memory cell stores is allocated in a row stripe shape for each word line 130 and is programmed in order on every other word line 130, the same as in the first and second embodiments. FIG. 14 shows an example in which first group memory cells are allocated so that five-levels data is stored and second group memory cells are allocated so that seven-levels data is stored. Two memory cells which are adjacent on the same bit line 140 store data of different amounts respectively by this allocation. Also, two memory cells which are adjacent on the same bit line 140 are allocated as a pair. Below, an example allocation of the memory cells MC2-2 and MC2-3 as a pair will be explained. Furthermore, the allocation of the amounts of data to be stored and the allocation of the memory cell pair is allocated in advance based on a memory cell address. Then, the data is stored in a ROM fuse as fuse data, read from a ROM region by a ROM read operation and set in a latch circuit. This is the same as in the first and second embodiments of the present invention.

These pair of memory cells MC2-2 and MC2-3 are not allocated with an actual address but a virtual address. For example, a virtual page address m is allocated to the pair of memory cells MC2-2 and MC2-3.

By allocating this virtual page address m, it is possible to treat the memory cell MC2-2 as a first data page of this virtual memory cell and the memory cell MC2-3 as the second data page of this virtual memory cell. Also, a first data of data which is input by a calculation process by a sense amplifier is stored in the first data page and a second data of this input data is stored in the second data page. Therefore, it is possible to store five-levels×seven-levels=thirty-five-levels>thirty-two-levels (5 bits) in one virtual memory cell and it is possible to make the storage capacity of one memory cell 2.5 bits over the entire memory chip. Even in the case where it is easy to control a four-levels data (2 bits data) voltage, it is assumed that there are cases where it is difficult to remove the influence of capacitive coupling as stated above at the time of storing four-levels data in all the memory cells. Even in this case, however, according to the third embodiment of the present invention, it is possible to secure a capacity more than in the case where four-levels data (2 bits data) is stored in all the memory cells. Thus, while reducing interference of an adjacent memory cell, it is possible to realize large capacity over the entire memory.

Page programming to a virtual memory cell is performed on each word line 130. In a virtual memory cell which consists of the memory cells MC2-2 and MC2-3 in FIG. 14, the word line WL2 (130e) is selected, the memory cell MC2-2 is programmed with first data programming then the word line WL3 (130o) is selected and the memory cell MC2-3 is selected and programmed with second data programming.

In the case of storing 5 bits (5 digits) data in a virtual memory cell, the data which is stored has thirty-two varieties. An input from an external source is specified as a virtual address m and input. This data which is input is allocated as either one of five-levels of data from [0] to [4] as first data of the virtual memory cell and one of seven-levels of data from [0] to [6] are allocated as second data of the virtual memory cell by the sense amplifier 40. The first data [0] to [4] are allocated in the following way, for example, [0] is allocated as [000], [1] is allocated as [001], [2] is allocated as [010], [3] is allocated as [011] and [4] is allocated as [100]. Similarly, each of the second data [0] to [6] is allocated in the following way, for example, [000], [001], [010], [011], [100], [101], and

[110]. By combining the first data and the second data there is a combination of thirty-five varieties, [00], [01] to [06], [10], [11] to [16], [20], [21] to [26], [30], [31] to [36], [40], [41] to [46]. However, in order to convert thirty-two-levels data into five-levels×seven-levels=thirty-five-levels data, data is not allocated to three-levels of this thirty-five-levels data. Therefore, according to this allocation, the two digit number [02] of the virtual memory cell is stored as [000] first data and as [010] second data.

In the programming of the data of this [02], [000] is programmed to the memory cell MC2-2 by programming first data to the virtual memory cell and then [010] is programmed to the memory cell MC2-3 by programming second data to the virtual memory cell.

Reading is similarly performed by reading [000] from the memory cell MC2-2 as first data of the virtual memory cell and by reading [010] from the memory cell MC3-2 as the second data of the virtual memory cell by the sense amplifier 40. Then, after latching by the sense amplifier 40, the opposite calculation is performed by the sense amplifier 40 and is output externally as [02] data of the virtual memory cell.

Programming is performed in the order first data programming then second data programming. The memory cell MC2-2 which is programmed with first data is allocated so that five-levels data is stored. Therefore, influence of an adjacent memory cell caused by capacitive coupling by programming to the memory cell MC2-2 also reaches the memory cell MC2-3 which is programmed with second data. However, because this programming is five-levels data programming the number of applying programming voltages is few and therefore stress at the time of programming to a seven-levels cell is reduced. In addition, because a read voltage of the non-selected word lines 130 can be set lower than that of a seven-levels cell, it is possible to reduce Read Disturbance. Therefore, the influence of interference of an adjacent memory cell is small. In addition, because the memory cell MC2-3 which is programmed with second data is programmed with seven-levels data, influence occurs on the adjacent memory cell MC2-2. However, this memory cell MC2-2 is already programmed with five-levels data which has a threshold distribution with a wide width by seven-levels data and consequently it is possible to absorb this influence. Therefore, the influence of interference of an adjacent memory cell is small. In the nonvolatile semiconductor memory device 10 related to the third embodiment of the present invention as stated above, the memory cells which are adjacent in a bit line direction are allocated so that different amounts of data are stored in each memory cell and because programming is controlled so that page programming is performed in order on each word line 130, it is possible to control the widening of a threshold distribution which is the cause of capacitive coupling.

Furthermore, in the nonvolatile semiconductor memory device 10 related to the third embodiment of the present invention, even if five-levels data and seven-levels data is allocated as two kinds of data amounts which are stored in a memory cell, because half of the memory cells are programmed with five-levels data it is possible to secure a fixed programming speed across the entire memory. Therefore, it is possible to achieve high speed programming and increase capacity.

Furthermore, in the nonvolatile semiconductor memory device 10 related to the third embodiment of the present invention, the amount of data which is stored in a memory cell is allocated according to fuse data and the programming sequence is controlled. Therefore, because an operation mode is switched by switching fuse data it is possible to meet a plurality of demands within one memory chip. Therefore, it is also possible to propose a low cost and highly reliable memory chip. This is the same as in the first and second embodiments of the present invention.

Furthermore, according to the nonvolatile semiconductor memory device 10 related to the third embodiment of the present invention, it is possible to reduce the interference of an adjacent memory cell which is the cause of capacitive coupling. Therefore, it is possible to stably control a variation in a memory cell's threshold voltage when storing eight-levels data (3 bits data), however, even in the case where a variation in a memory cell's threshold voltage can not be stably controlled when storing sixteen-levels data (4 bits data), if the data to be stored is an amount less than sixteen-levels data, for example, eleven-levels data or twelve-levels data, then there are cases where it is possible to stably control a variation in a memory cell's distribution voltage. In this case, by using a virtual memory cell, it is possible to use six-levels data and eleven-levels data, for example, as two kinds of multi-levels data and realize large capacity.

Figure 15:
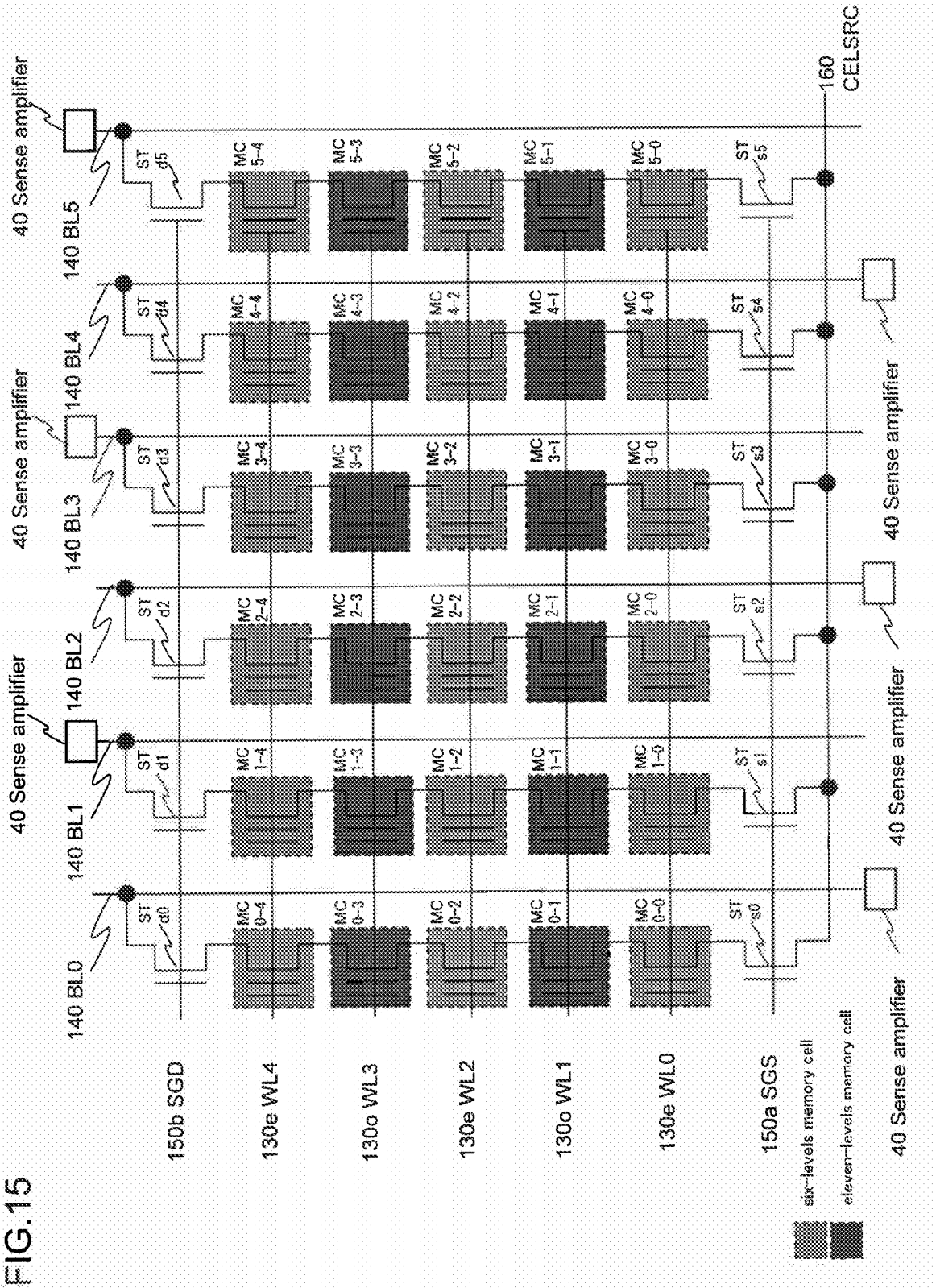
FIG. 15 is a typical characteristic of the allocation of six-levels data and eleven-levels data to a memory cell in the nonvolatile semiconductor memory device relating to one embodiment of this invention.

FIG. 15 is a typical drawing of the allocation of memory cell's in the nonvolatile semiconductor memory device 10 related to the third embodiment of the present invention in the case where six-levels data and eleven-levels data are allocated. The first group of memory cells is allocated so that six-levels data is stored and the second group of memory cells is allocated so that eleven-levels data is stored. Furthermore, two memory cells are allocated as a pair so that they form one virtual memory cell. This allocation is allocated in advance and given as fuse data.

For example, either one of six-levels of data from [0] to [5] is allocated as first data of the virtual memory cell and one of eleven-levels of data from [0] to [10] are allocated as second data of the virtual memory cell. The first data [0] to [5] is allocated in the following way, for example, [0] is allocated as [000], [1] is allocated as [001], [2] is allocated as [010], [3] is allocated as [011], [4] is allocated as [100] and [5] is allocated as [101]. Similarly, each of the second data [0] to [10] is allocated in the following way, for example, [0000], [0001], [0010], [0011], [0100], [0101], [0110], [0111], [1000], [1001] and [1010]. Programming and reading operations are directed to the virtual memory cell, however, because they are the same as in the case of five-levels data and seven-levels data explained above, they will not be explained here. By this allocation the number of levels is six-levels×eleven-levels=sixty-six-levels>sixty-four-levels (6 bits) and the storage capacity in one memory cell becomes 3 bits. Although it is possible to stably control a variation in a memory cell's threshold voltage when storing eight-levels data, in the case of storing eight-levels data (3 bits data) in all the memory cells (in this case, the data storage capacity of the entire memory becomes 3 bits) it is thought that interference of an adjacent memory cell can not be effectively controlled. In the nonvolatile semiconductor memory device 10 of the third embodiment of the present invention, because one memory cell of a pair of memory cells which are adjacent on the same bit line 140 is a six-levels data cell, the number of applying programming voltages is fewer than when programming eight-levels data and because there is a shift margin interference can be controlled. However, control of a variation in a cell's threshold voltage when storing eleven-levels data becomes more difficult than control of a variation in a memory cell's threshold voltage when storing eight-levels data. However, control of a variation in a memory cell's threshold voltage when storing eleven-levels data is easier than control of a variation in a cell's threshold voltage when storing sixteen-levels data and therefore does not require additional technology. Therefore, it is possible to make the storage capacity of one memory cell 3 bits over the entire chip by the above stated method and it is possible to achieve large capacity while increasing programming speed. In addition, because an operation mode can be switched by switching fuse data it is possible to meet a plurality of demands within one memory chip and propose a low cost and highly reliable memory chip.

Figure 16:
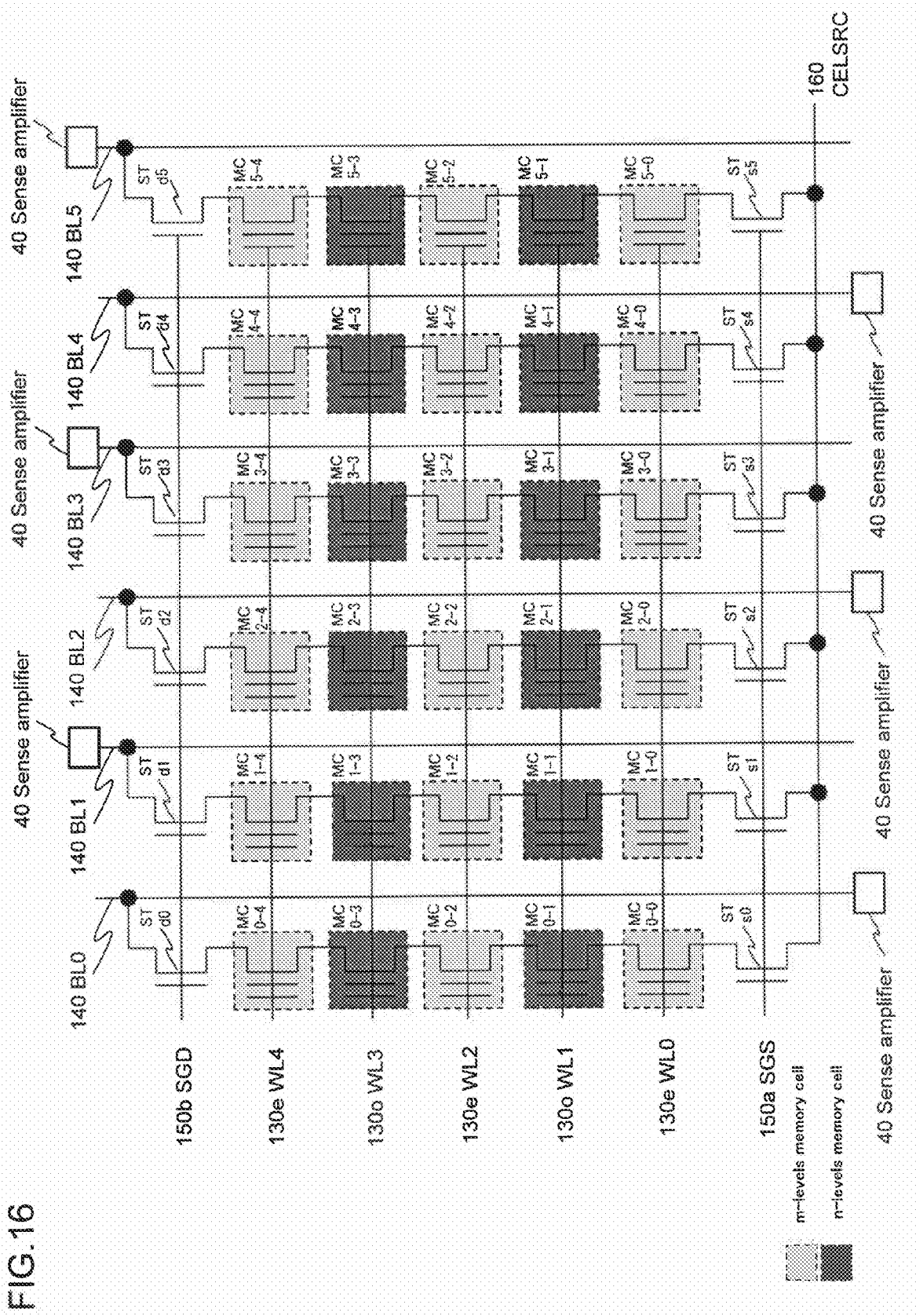
FIG. 16 is a typical characteristic of the allocation of m-levels data and n-levels data (m and n are natural numbers) to a memory cell in the nonvolatile semiconductor memory device relating to one embodiment of this invention.

Furthermore, it is possible to increase a memory's entire capacity while reducing interference of an adjacent memory cell according to the progress of technology whereby a multi-levels threshold voltage is stably controlled in the nonvolatile semiconductor memory device 10 related to the third embodiment of the present invention. FIG. 16 is a typical drawing of the allocation of two kinds of data amounts which are stored by a memory cell, in which the data is given as m-level data and n-level data (m and n are natural numbers) and allocated in a row stripe shape on each word line 130. Programming is controlled so that page programming is performed in order on each word line 130. This allocation is given in advance as fuse data. This is the same as in the first and second embodiments. In addition, because the effects are also the same as in the first and second embodiments they are not explained here. Even if the technology in which a multi-levels threshold voltage can be stably controlled progresses, the nonvolatile semiconductor memory device 10 related to the third embodiment of the present invention is able to sufficiently effective.

Fourth Embodiment

In recent years, a flash memory has been proposed which is arranged with a two transistor type cell having the best parts of both a NOR type flash memory and a NAND type flash memory. This flash memory is arranged with a memory cell which includes two MOS transistors wherein one MOS transistor which functions as a nonvolatile storage part has a construction comprised of a control gate and a floating gate and is connected to a bit line. The other MOS transistor is connected to a source line and is used for selecting a memory cell.

However, the area of one memory cell in a flash memory which is arranged with a two transistor type cell having this construction becomes large. Therefore, it is necessary to store multi-levels data in one memory cell in order to guarantee storage capacity. However, in the case of storing multi-levels data, the NAND type flash memory is the same in that interference of an adjacent memory cell due to capacitive coupling with an adjacent memory cell MC occurs. In the flash memory which is arranged with a two transistor type cell having one sense amplifier arranged on each and every bit line 140 in the fourth embodiment of the present invention, a predetermined multi-levels data and a data amount (including two-levels data) less than this predetermined multi-levels data are allocated every other word line 130 as data to be stored by a memory cell, and controlled so that page programming is performed in order on each word line 130 to each memory cell.

Figure 17:
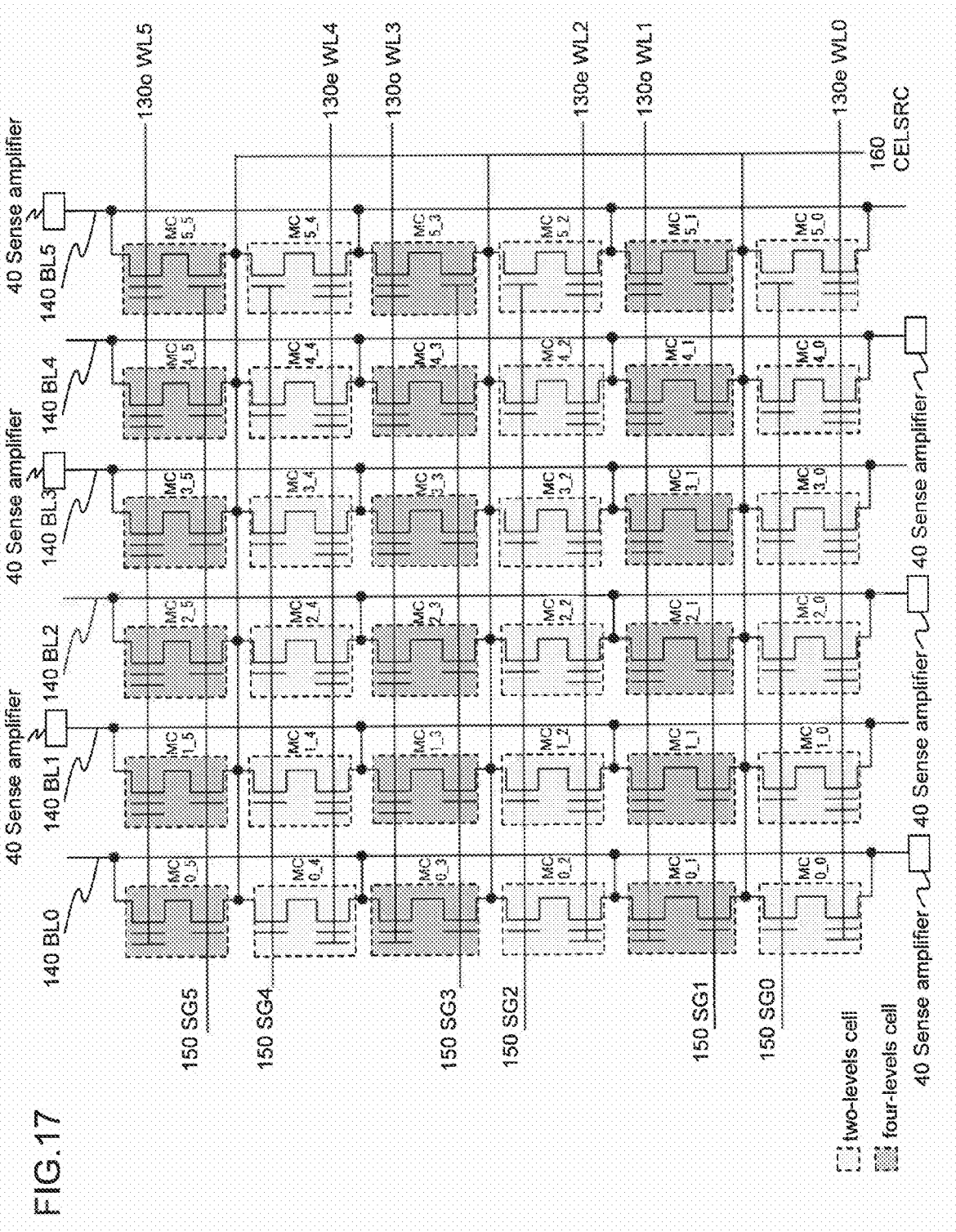
FIG. 17 is a typical characteristic of the allocation of data and an outline construction of flash memory arranged with a two transistor type cell relating to one embodiment of this invention.

FIG. 17 is an outline construction drawing of a flash memory arranged with a two transistor type cell related to the fourth embodiment of the present invention. A memory cell array has (m+1)×(n+1), (however, m and n are natural numbers) memory cells from MC0-0 to MCm-n which are arranged in a matrix form, however, for the purposes of explanation, they are shown as memory cells MC0-0 to MC5-5 in FIG. 17. Each memory cell has a memory cell transistor MT and a selection transistor ST which are mutually connected by a current route. The memory cell transistor MT is has a stack gate construction which has a floating gate formed on a semiconductor substrate and separated by insulation layers and a control gate which is formed above the floating gate and separated by a gate insulation layer. A source region of the memory cell transistor MT is connected to a drain region of the selection transistor ST. In addition, the memory cells which are adjacent in a column direction share a selection transistor ST source region or a memory cell transistor MT drain region.

The control gate of a memory cell transistor MT of memory cells on the same row are commonly connected by any one of the word lines WL0 to WL5 (130) and the gate of a selection transistor ST of memory cells on the same row are connected to any one of the select gate lines SG0 to SG5 (150). Also, the drain of the memory cell transistor MT of memory cells on the same column is commonly connected to any of the bit lines BL0 to BL5. And, the source of the selection transistor ST of a memory cell is commonly connected to a source line CELSRC 160.

The programming of data in a flash memory arranged with this two transistor type cell is performed at one time on all the memory cells connected to any one of the word lines 130. And, [0] data or [1] data is programmed depending on whether electrons are injected into the floating gate of the memory cell transistor MT. The injection of electrons into the floating gate is conducted by FOWLER—NORDHEIM (FN) TUNNELING.

First, in FIG. 17, programming data ([1], [0]) is input from an Input/Output terminal (not shown in the drawing). Then, this programming data is stored in each latch circuit (not shown in the drawing) arranged on each bit line 140. When [1] data is stored in a latch circuit, 0V is applied to a bit line 140, and conversely, when [0] data is stored, VBB (−6V) is applied.

A first row decoder (not shown in the drawing) selects any one of the word lines WL0 to WL5 (130) and Vpp (for example, 10 V) is applied to a selected word line 130. A second row decoder (not shown in the drawing) applies VBB (−6V) to the selection gate lines SG0 to SG5 (150). Also, the voltage of the memory cell substrate is given as VBB (−6V). As a result, all the selection transistors ST become an OFF state. Therefore, the selection transistor ST and the source line CELSRC 160 are electrically separated.

As a result of this, a voltage which corresponds to [1] data or [0] data is applied to the drain region of the memory cell transistor MT via the bit lines BL0 to BL5 (140). Then, Vpp (10V) is applied to a selected word line 130 and 0V is applied to the drain of the memory cell transistor MT which is to be programmed with [1] data and VBB (−6V) is applied to the drain region of the memory cell transistor MT which is to be programmed with [0] data. Therefore, in the memory cell transistor MT which is to be programmed with [1] data, because the voltage differential (10V) between the gate and drain is insufficient, electrons are not injected into the floating gate and the memory cell transistor MT retains a negative threshold voltage. Alternatively, in the memory cell transistor MT which is to be programmed with [0] data, because the voltage differential (16V) is large between the gate and the drain, the floating gate is injected with electrons by FN tunneling. As a result, the threshold voltage of the memory cell transistor MT changes to positive.

It is possible to read the data from a plurality of memory cells which are commonly connected to any one word line 130 at one time. In FIG. 17, the second row decoder (not shown in the drawing) selects any one of the selection gate lines SG0 to SG5 (150). A [H] level voltage (for example, Vcc) is applied to the selection gate line SG150. The voltages of the non-selected gate lines SG150 are all [L] level (for example, 0V). Therefore, the selection transistor ST which is connected to a selection gate line SG150 becomes an ON state and the selection transistor ST which is connected to a non-selected selection gate line SG150 becomes an OFF state. As a result, the selection transistor ST within the selected memory cell is electrically connected to the source line CELSRC 160. Also, the first row decoder (not shown in the drawing) makes the voltage of all the word lines WL0 to WL5 (130) an [L] level [0V]. In addition, a source line driver (not shown in the drawing) makes the voltage of the source line CELSRC 160 0V.

A voltage, for example about 1V, is applied to each of the bit lines BL0 to BL5 (140). Then, because the memory cell transistor MT of the memory cell which is programmed with [1] data has a negative threshold voltage, it becomes an ON state. Therefore, in the memory cell which is connected to a selection gate line SG150, a current flows towards the source line CELSRC 160 via a current route of the memory cell transistor MT and the selection transistor ST from a bit line 140. Alternatively, because the memory cell transistor MT of the memory cell which is programmed with [0] data has a positive threshold voltage, it becomes an OFF state. Therefore, a current does not flow towards the source line CELSRC 160 from a bit line 140. As a result of the above, the voltages of the bit lines BL0 to BL5 (140) change and a read operation is performed by a sense amplifier (not shown in the drawing) which amplifies the amount of that change.

Erasing of the data in all the memory cells which share a well region is performed at one time. In FIG. 17, the first row decoder (not shown in the drawing) makes the voltages of all the word lines WL0 to WL5 (130) VBB (−6V). In addition, the voltage of the semiconductor substrate (well region) is Vpp (10V). Therefore, electrons are extracted from the floating gate of the memory cell transistor MT of the memory cell to the semiconductor substrate by FN tunneling. Consequently, the threshold voltage of all the memory cells becomes negative and data is erased.

Even in a flash memory 10 arranged with a two transistor type cell in which programming, reading and erasing is performed via the above stated operations, in the case where multi-levels data is programmed, because the width of a threshold distribution is narrowed, the programming voltage Vpgm is stepped up by a fixed ratio Dvpgm which is smaller than two-levels programming, from an initial value. The programming voltage Vpgm is applied to a memory cell as a pulse signal (programming pulse) and every time the pulse signal is applied to a memory cell, the pulse signal rises by that height (programming voltage Vpgm). Therefore, because there is capacitive coupling in each memory cell which is adjacent to a memory cell in a word line direction and a bit line direction, each memory cell receives and influence of the widening of a threshold distribution by programming an adjacent memory cell.

In the flash memory 10 arranged with a two transistor type cell related to the fourth embodiment of the present invention, the amount of data which is stored in a memory cell is allocated in a row stripe shape so that different amounts of data are stored on every word line 130. In the present embodiment, the different amounts of data which are allocated are two-levels data and four-levels data. In FIG. 17, the word lines 130 are divided in to even word lines 130e and odd word lines 130o and the first group of memory cells which are connected to the even word lines 130e are allocated so that a small amount of data is stored and the second group of memory cells which are connected to the odd word lines 130o are allocated so that multi-levels data (here four-levels data) with an amount more than the first group of memory cells is stored.

This allocation is decided in advance and is provided to the flash memory 10 which is arranged with a two transistor type cell, as fuse data. The allocation method which allocates data to a memory cell as fuse data based on the address of a memory cell is the same as in the first, second and third embodiments.

Specifically, in FIG. 17, the first group of memory cells in which the memory cell MC2-2 belongs is allocated so that two-levels data is stored, and the second group of memory cells which is connected to an odd word line 130o is allocated so that four-levels data is stored. Therefore, the memory cells MC2-1 and MC2-3 which are adjacent to the memory cell MC2-2 on the same bit line BL2 (140) are allocated so that either one stores four-levels data.

Here, capacitive coupling with an adjacent memory cell in the case where data is programmed to the memory cell MC2-2 in FIG. 17 will be explained. First, the word line WL2 (130e) is selected by a first row decoder (not shown in the drawing) and applied with Vpp. The other word lines WL0, WL1, WL3 through to WL5 (130) are 0V. In addition, the entire selection gate lines SG0 to SG5 (150) are VBB (−6V). Next, all the bit lines 140 are applied with 0V or VBB. Then, the floating gate of all the memory cells MC0-2 through to MC5-2 which are connected to the word line WL2 (130e) are injected with electrons.

Alternatively, electrons are not injected into the floating gates of the memory cells which are connected to the word lines WL0, WL1, WL3, WL4 and WL5 (130) because the voltage of these word lines is 0V, regardless of the voltage of the bit lines BL0 to BL5 (140). Therefore, the memory cells MC2-1 and MC2-3 which are adjacent to the memory cell MC2-2 in a bit line direction are not programmed. Here, because there is capacitive coupling between the memory cell MC2-2 and the adjacent memory cells MC2-1 and MC2-3 influence of capacitive coupling is received by each memory cell by applying a programming voltage to the memory cell MC2-2. However, because the memory cell MC2-3 is not yet programmed there is no influence. However, the memory cell MC2-1 is already programmed with four-levels data and because the memory cell MC2-2 is programmed with two-levels data, the threshold voltage shift is small and the influence of capacitive coupling of an adjacent memory cell is small. In addition, because a read voltage of the non-selected word lines 130 can be set lower than when programming four-levels data, it is possible to reduce Read Disturbance.

Next, the word line WL3 (130o) is selected, all the bit lines 140 are selected and 0V or VBB is applied. Then, electrons are injected into the floating gate of the memory cells MC0-3 to MC5-3 which are connected to the word line WL3 (130o) and programming is performed. Because these memory cells MC0-3 to MC5-3 are allocated so that four-levels data is stored, a voltage which has been narrowly stepped up is applied to each of these memory cells. Therefore, the influence of the interference of an adjacent memory cell due to capacitive coupling with the memory cell MC2-3 reaches the memory cells MC2-2 and MC2-4 which are adjacent in a bit line direction to the memory cell MC2-3. However, the memory cell MC2-2 is already programmed with two-levels data. Because the memory cells which are programmed with two-levels data have a sufficient margin in the threshold distribution it is possible to absorb the influence of an adjacent memory cell's interference. In addition, because data has not yet been programmed to the memory cell MC2-4, influence does not occur. Therefore, there is little influence of an adjacent memory cell's interference by capacitive coupling of the memory cells MC2-2 and MC2-4. In the flash memory 10 which is arranged with a two transistor type cell related to the fourth embodiment of the present invention, because adjacent memory cells in a bit line direction are allocated so that different amounts of data are stored in each cell and because programming is controlled so that page programming is performed in order on each word line 130, it is possible to reduce a widening of the threshold distribution caused by capacitive coupling.

In addition, in the fourth embodiment of the present invention, because half of the memory cells are two-levels cells in the case of a two-levels and four-levels mixture mode, it is possible to accelerate programming speed of the entire memory more than in the case of a four-levels mode. Therefore, it is possible to achieve large capacity and high speed.

Furthermore, in the nonvolatile semiconductor memory device 10 related to the fourth embodiment of the present invention, because an amount of data which is stored in a memory cell is allocated according to fuse data and because the programming sequence is controlled, it is possible meet a plurality of demands within one memory chip. That is, in the case where programming speed is demanded, it is possible to use the entire memory as a two-levels cell mode which can program at high speed by switching an operation mode. Alternatively, in the case where large capacity rather than programming speed is demanded, it is possible to use the entire memory as a four-levels mode which can store a high capacity by switching an operation mode. Furthermore, in the case where either programming speed or large capacity is demanded, by using a two-levels and four-levels mixture mode by switching an operation mode, it is possible to meet such demands. In addition, because it is possible to meet the demands of a variety of users in the same memory chip, it is possible to achieve an efficient production line, reduce production costs and realize a low cost memory chip.

In addition, in the fourth embodiment of the present invention, because the two-levels and four-levels mixture mode is an operation mode which can reduce programming and reading stress while increasing programming performance, reliability is high. In the case where reliability is low by using the entire memory as four-levels cell mode, it is effective for guaranteeing reliability in the same chip aimed at the high end market which emphasizes reliability and performance.

Furthermore, in the fourth embodiment of the present invention, the data which is stored was given as two-levels data and four-levels data, however, the data is not limited to this. For example, other combinations such as two-levels data and eight-levels data or four-levels data and eight-levels data may be used. Furthermore, the amount of the other data may be sixteen-levels data. The two kinds of data amounts which a memory cell stores are allocated in a row stripe shape for each word line 130 and controlled so that different data amounts are stored in memory cells adjacent on the same bit line 140 and by controlling the programming sequence for each word line 130 it is possible to obtain the same effects.

What is claimed is:

1. A nonvolatile semiconductor memory device comprising:
   a plurality of word lines;
   a plurality of bit lines;
   a plurality of sense amplifiers, each amplifier being connected to one of said plurality of bit lines respectively; and
   a memory cell array including a memory cell region including a plurality of memory strings having a plurality of electrically reprogrammable memory cells connected in series, each cell of said plurality of memory cells having two or more storage states, said plurality of memory cells being connected to a corresponding word line of said plurality of word lines respectively, said plurality of memory strings being connected to a corresponding bit line of said plurality of bit lines respectively, and at the time of programming, the number of said storage states being different in two of said memory cells, one of said two memory cells being arranged in the middle of a series of three memory cells of said plurality of memory cells connected in series to the same bit line, and the other memory cell of said two memory cells being adjacent to the middle memory cell.

2. The nonvolatile semiconductor memory device according to claim 1, said each sense amplifier further comprising:
   a storage states change circuit which changes said storage states of said memory cell transistors respectively by an external input.

3. The nonvolatile semiconductor memory device according to claim 1, wherein,
   said each sense amplifier further comprises a storage states change circuit which changes said storage states of said memory cell transistors respectively,
   said memory cell array further including a ROM region, and
   the number of said storage states of said memory cell transistors are stored in said ROM region.

4. The nonvolatile semiconductor memory device according to claim 1, said nonvolatile semiconductor memory device further comprising:
   a power on reset circuit having at least two internal fuse circuits which store the number of said storage states of said memory cell transistors according to a corresponding address of said memory cell transistors, the number of said storage states being changed according to the number of said storage states stored in either of said two internal fuse circuits at the time of resetting said nonvolatile semiconductor memory device.

5. The nonvolatile semiconductor memory device according to claim 1, wherein the nonvolatile semiconductor memory device is a NAND type flash memory.

6. The nonvolatile semiconductor memory device according to claim 1, wherein each of said storage states is $2^n$ (n is a natural number).

7. The nonvolatile semiconductor memory device according to claim 1, further comprising a group of four memory cells connected in series to the same bit line wherein the number of storage states in the first and third memory cells is different to the number of storage states in the second and fourth memory cells.

8. The nonvolatile semiconductor memory device according to claim 1, wherein the amount of storage states to be stored in a memory cell is allocated to every other word line in units of one word line.

9. A nonvolatile semiconductor memory device comprising:
   a plurality of word lines having odd word lines and even word lines;
   a plurality of bit lines;
   a plurality of sense amplifiers, each amplifier being connected to one of said plurality of bit lines respectively; and
   a memory cell array including a memory cell region including a plurality of memory strings having a plurality of electrically reprogrammable memory cells connected in series, each memory cell of said plurality of memory cells having two or more storage states, said plurality of memory cells being connected to a corresponding word line of said plurality of word lines respectively, said plurality of memory strings being connected to a corresponding bit line of said plurality of bit lines respectively, at the time of programming, the number of said storage states of said memory cells connected to said odd word lines is different from the number of said storage states of said memory cells connected to said even word lines, and the number of said storage states being different in two of said memory cells, one of said two memory cells being arranged in the middle of a series of three memory cells of said plurality of memory cells connected in series to the same bit line, and the other memory cell of said two memory cells being adjacent to the middle memory cell.

10. The nonvolatile semiconductor memory device according to claim 9, said each sense amplifier further comprising:
a storage states change circuit which changes said storage states of said memory cell transistors respectively by an external input.

11. The nonvolatile semiconductor memory device according to claim 9, wherein,
said each sense amplifier further comprises a storage states change circuit which changes said storage states of said memory cell transistors respectively,
said memory cell array further including a ROM region, and
the number of said storage states of said memory cell transistors are stored in said ROM region.

12. The nonvolatile semiconductor memory device according to claim 9, said nonvolatile semiconductor memory device further comprising:
a power on reset circuit having at least two internal fuse circuits which store the number of said storage states of said memory cell transistors according to a corresponding address of said memory cell transistors, the number of said storage states being changed according to the number of said storage states stored in either of said two internal fuse circuits at the time of resetting said nonvolatile semiconductor memory device.

13. The nonvolatile semiconductor memory device according to claim 9, wherein the nonvolatile semiconductor memory device is a NAND type flash memory.

14. The nonvolatile semiconductor memory device according to claim 9, further comprising a group of four memory cells connected in series to the same bit line wherein the number of storage states in the first and third memory cells is different to the number of storage states in the second and fourth memory cells.

15. The nonvolatile semiconductor memory device according to claim 9,
wherein the amount of storage states to be stored in a memory cell is allocated to every other word line in units of one word line.

16. A nonvolatile semiconductor memory device comprising:
a plurality of word lines;
a plurality of bit lines;
a plurality of sense amplifiers, each amplifier being connected to one of said plurality of bit lines respectively; and
a memory cell array including a memory cell region including a plurality of memory strings having a plurality of electrically reprogrammable memory cells connected in series, each memory cell of said plurality of memory cells having two or more storage states, said plurality of memory cells being connected to a corresponding word line of said plurality of word lines respectively, said plurality of memory strings being connected to a corresponding bit line of said plurality of bit lines respectively, each of first addresses being allocated to one of said plurality of said memory cells, each of second addresses being allocated to two of said plurality of memory cells which are adjacent on the same bit line, said two of said plurality of memory cells being selected by a corresponding first address of said first addresses and a corresponding second address of said second addresses, and at the time of programming, the number of said storage states being different in two of said memory cells, one of said two memory cells being arranged in the middle of a series of three memory cells of said plurality of memory cells connected in series to the same bit line, and the other memory cell of said two memory cells being adjacent to the middle memory cell.

17. The nonvolatile semiconductor memory device according to claim 16, said each sense amplifier further comprising:
a storage states change circuit which changes said storage states of said memory cell transistors respectively by an external input.

18. The nonvolatile semiconductor memory device according to claim 16, wherein,
said each sense amplifier further comprises a storage states change circuit which changes said storage states of said memory cell transistors respectively,
said memory cell array further including a ROM region, and
the number of said storage states of said memory cell transistors are stored in said ROM region.

19. The nonvolatile semiconductor memory device according to claim 16, said nonvolatile semiconductor memory device further comprising:
a power on reset circuit having at least two internal fuse circuits which store the number of said storage states of said memory cell transistors according to a corresponding address of said memory cell transistors, the number of said storage states being changed according to the number of said storage states stored in either of said two internal fuse circuits at the time of resetting said nonvolatile semiconductor memory device.

20. The nonvolatile semiconductor memory device according to claim 16, said nonvolatile semiconductor memory device further comprising:
a calculation circuit which converts one of said first addresses into a corresponding second address of said second addresses and one of said second addresses into a corresponding first address of said first addresses.

21. The nonvolatile semiconductor memory device according to claim 20, said nonvolatile semiconductor memory device further comprising:
a plurality of latch circuits, each of said plurality of latch circuits being connected to a corresponding sense amplifier of said plurality of sense amplifiers, a first data and a second data being stored in said two of said plurality of memory cells which are adjacent on the same bit line respectively, said first data corresponding to said second address being read and latched in a corresponding latch circuit, said second data corresponding to said second address being read, and said first data latched in said corresponding latch circuit and said second data being logically operated and output as a data of said second address.

22. The nonvolatile semiconductor memory device according to claim 16, wherein the nonvolatile semiconductor memory device is a NAND type flash memory.

23. The nonvolatile semiconductor memory device according to claim 16, further comprising a group of four memory cells connected in series to the same bit line wherein the number of storage states in the first and third memory cells is different to the number of storage states in the second and fourth memory cells.

24. The nonvolatile semiconductor memory device according to claim 16, wherein the amount of storage states to be stored in a memory cell is allocated to every other word line in units of one word line.

* * * * *